US012745423B2

(12) United States Patent
Liaw

(10) Patent No.: US 12,745,423 B2
(45) Date of Patent: Sep. 22, 2026

(54) SEMICONDUCTOR STRUCTURE

(71) Applicant: Taiwan Semiconductor Manufacturing Company, Ltd., Hsinchu (TW)

(72) Inventor: Jhon-Jhy Liaw, Zhubei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1010 days.

(21) Appl. No.: 17/843,815

(22) Filed: Jun. 17, 2022

(65) Prior Publication Data

US 2023/0411468 A1 Dec. 21, 2023

(51) Int. Cl.
*H10D 30/67* (2025.01)
*H10D 30/43* (2025.01)
(Continued)

(52) U.S. Cl.
CPC ......... *H10D 30/6735* (2025.01); *H10D 30/43* (2025.01); *H10D 30/6713* (2025.01);
(Continued)

(58) Field of Classification Search
CPC ............... H10D 30/6729; H10D 30/43; H10D 30/6713; H10D 30/6735; H10D 30/6757; H10D 62/121; H10D 84/85; H10D 30/797; H10D 64/017; H10D 30/014; H10D 62/822; H10D 84/0186; H10D 84/038; H10D 30/435; H10D 30/501–509; H10D 30/674; H10D 84/8311; H10D 84/8312; H10D 84/83135; H10D 84/83138; H10D 84/8314; H10D 84/8316; H10D 84/851–852; H10D 30/0273; H10D 30/01; H10D 30/019–0198; H01L 23/5286; H01L 21/76897; B82Y 10/00; H10W 20/427;
(Continued)

(56) References Cited

U.S. PATENT DOCUMENTS 9,209,247 B2 12/2015 Colinge et al.
9,236,267 B2 1/2016 De
(Continued)

*Primary Examiner* — Yara B Green
*Assistant Examiner* — Benjamin Michael Kupp
(74) *Attorney, Agent, or Firm* — Birch, Stewart, Kolasch & Birch, LLP

(57) ABSTRACT

A semiconductor structure includes a circuit cell having transistors. Each of the transistors includes nanostructures vertically stacked from each other, and a gate structure wrapped around the nanostructures and extending in a first direction. The semiconductor structure further includes a dielectric gate structure extending in the first direction and adjacent to the circuit cell in a second direction. The second direction is perpendicular to the first direction. The semiconductor structure further includes a first source/drain feature between adjacent two of the gate structures, a second source/drain feature between one of the gate structures and the dielectric gate structure, a first source/drain contact over the first source/drain feature and having a first width in the second direction, and a second source/drain contact over the second source/drain feature and having a second width in the second direction. The second width is greater than the first width.

20 Claims, 17 Drawing Sheets

(51) Int. Cl.

| | |
|---|---|
| ***H10D 62/10*** | (2025.01) |
| ***H10D 84/85*** | (2025.01) |
| ***H10W 20/41*** | (2026.01) |

(52) U.S. Cl.
CPC ..... *H10D 30/6729* (2025.01); *H10D 30/6757* (2025.01); *H10D 62/121* (2025.01); *H10D 84/85* (2025.01); *H10W 20/427* (2026.01)

(58) Field of Classification Search
CPC ........... H10W 20/069; H10W 20/0693; H10W 20/0696
See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 11,222,892 | B2 * | 1/2022 | Su | H10D 30/6757 |
| 11,335,606 | B2 * | 5/2022 | Yang | H01L 23/485 |
| 11,469,228 | B2 * | 10/2022 | Lee | H10D 64/62 |
| 11,710,739 | B2 * | 7/2023 | Yang | H10D 84/038 257/288 |
| 11,837,638 | B2 * | 12/2023 | Lee | H10D 30/6739 |
| 12,132,101 | B2 * | 10/2024 | Park | H10D 84/0151 |
| 12,211,941 | B2 * | 1/2025 | Yeom | H10D 30/6713 |
| 2022/0020691 | A1 * | 1/2022 | You | H01L 23/5286 |

* cited by examiner

SEMICONDUCTOR STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) transistors have been incorporated into memory devices (including, for example, static random-access memory, or SRAM, cells) and core devices (including, for example, standard logic, or STD, cells) to reduce chip footprint while maintaining reasonable processing margins.

However, as GAA transistors and circuit cells continue to be scaled down, existing contact features for source/drain features impact the isolation margin as well as cost. Accordingly, although existing technologies for fabricating circuit cells including GAA transistors have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
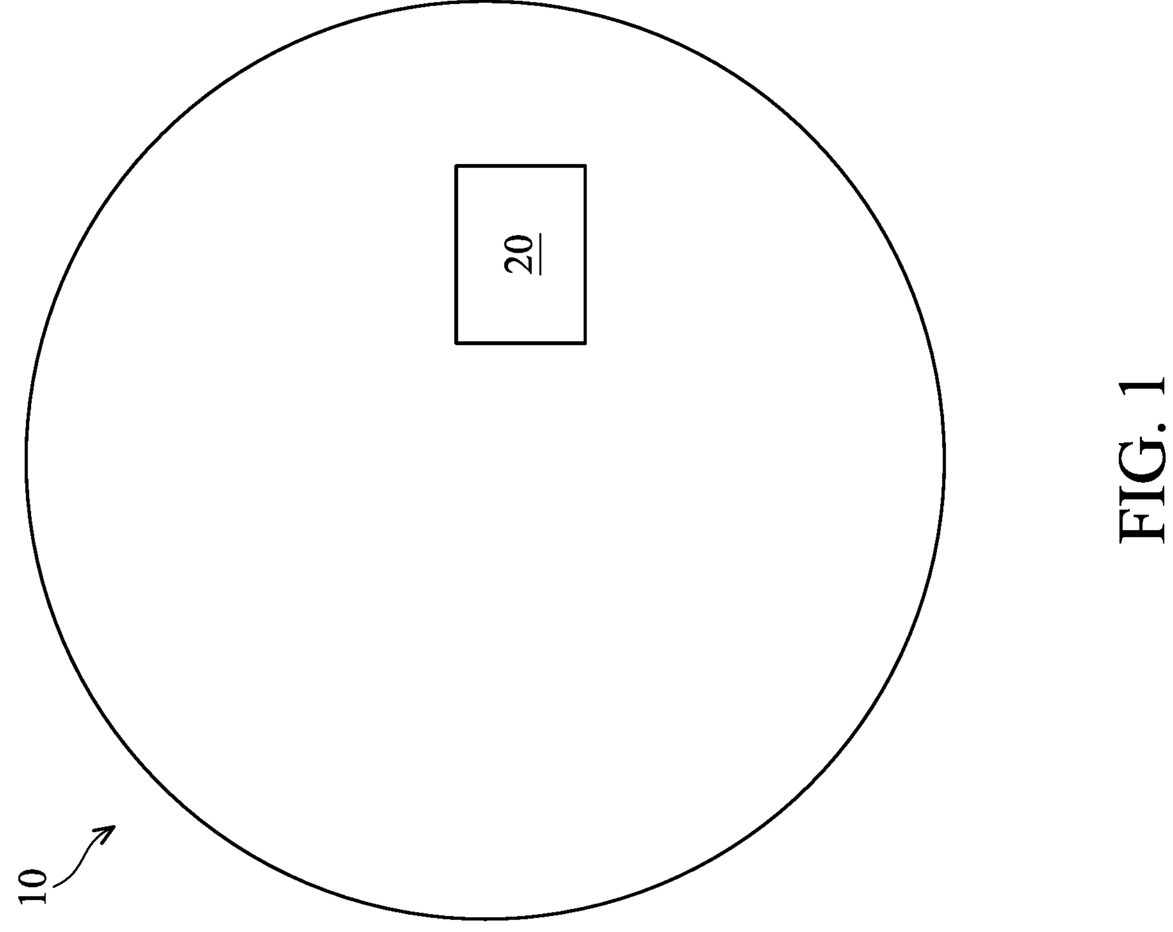
FIG. 1 is a fragmentary diagrammatic top view of an integrated circuit (IC) chip, in portion or entirety, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor structures, and more particularly to semiconductor structures of circuit cells having field-effect transistors (FETs), such as three-dimensional gate-all-around (GAA)

transistors, in an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it should be understood that other embodiments may offer different advantages, not all advantages are necessarily discussed herein, and no particular advantage is required for all embodiments. For example, embodiments discussed herein include circuit cells having non-self-aligned source/drain contact with different contact widths, such that improve cell performance and reduce processing cost. The details of the present disclosure are described below in conjunction with the accompanying drawings, which illustrate the layout and structure of circuit cells, according to some embodiments.

FIG. 1 is a fragmentary diagrammatic top view of an integrated circuit (IC) chip 10, in portion or entirety, in accordance with some embodiments of the present disclosure. The IC chip 10 may include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. The various microelectronic devices can be configured to provide the IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable region. As shown in FIG. 1, the IC chip 10 includes a logic region 20. The logic region 20 may include an array of circuit cells having various logic cells or standard (STD) cells. The logic cells or STD cells may include transistors and interconnect structures that combine to provide a logic device and/or a logic function, such as an inverter, an AND, an NAND, an OR, an NOR, a NOT, an XOR, an XNOR, other suitable logic devices, or combinations thereof. FIG. 1 has been simplified for the sake of clarity to better understand the inventive concepts of the present disclosure. Additional features can be added in the IC chip 10, and some of the features described herein can be replaced, modified, or eliminated in other embodiments of the IC chip 10.

FIGS. 2A to 2E are circuit schematics of various STD cells in the array of circuit cells in the logic region 20 of the IC chip 10, in accordance with some embodiments of the present disclosure.

Figure 2C:
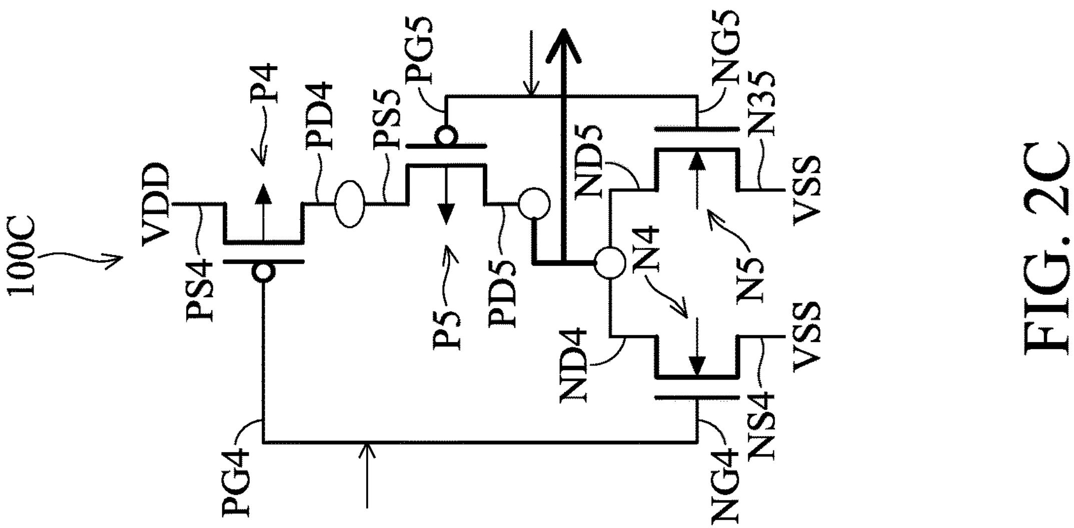
FIGS. 2A, 2B, 2C, 2D, and 2E are circuit schematics of various STD cells in the array of circuit cells in the logic region of the IC chip, in accordance with some embodiments of the present disclosure.
Figure 2B:
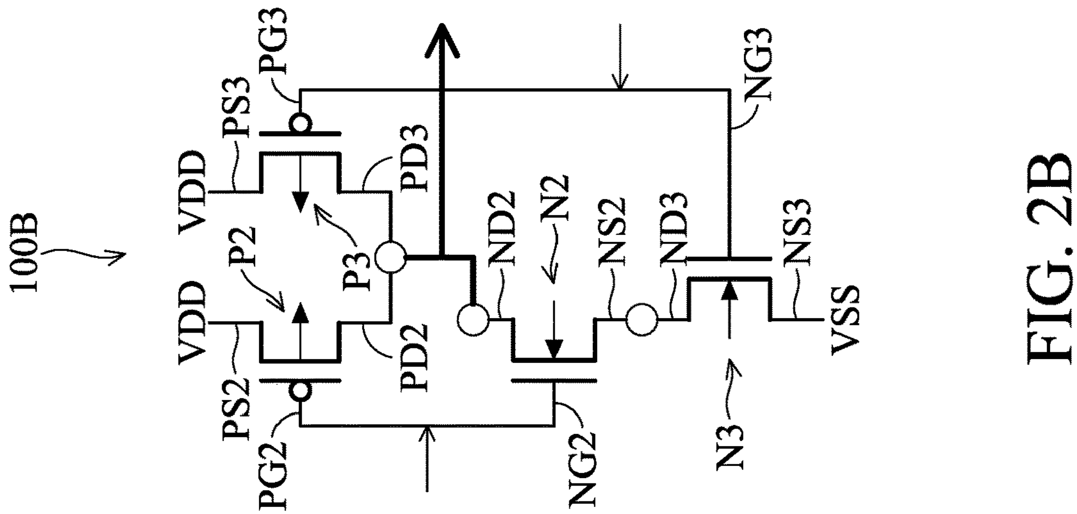
Figure 2A:
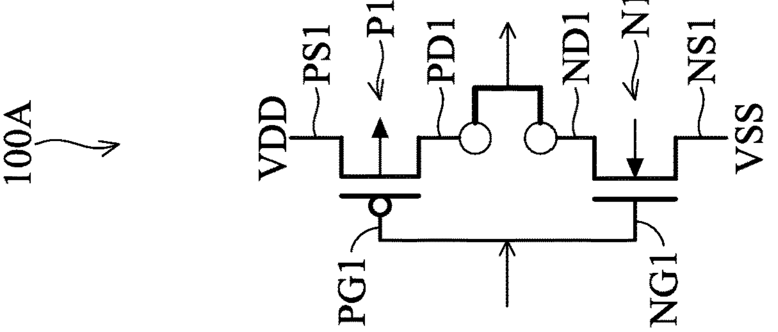

FIG. 2A shows an inverter 100A including an n-type transistor N1 and a P-type transistor P1. The n-type transistor N1 includes a source terminal NS1, a drain terminal ND1, and a gate terminal NG1, and the P-type transistor P1 includes a source terminal PS1, a drain terminal PD1, and a gate terminal PG1.

As shown in FIG. 2A, the gate terminals NG1 and PG1 are coupled with each other to operate as an input terminal of the inverter 100A. The drain terminals ND1 and PD1 are coupled with each other to operate as an output terminal of the inverter 100A. The source terminal PS1 is coupled to a VDD voltage. The source terminal NS1 is coupled to a VSS voltage (or a ground voltage).

FIG. 2B shows a NAND (also referred to as a NAND logic gate, a NAND device or a NAND cell) 100B including n-type transistors N2, N3 and P-type transistors P2, P3. The n-type transistor N2 includes a source terminal NS2, a drain terminal ND2, and a gate terminal NG2, and the n-type transistor N3 includes a source terminal NS3, a drain terminal ND3, and a gate terminal NG3. The P-type transistor P2 includes a source terminal PS2, a drain terminal PD2, and a gate terminal PG2, and the P-type transistor P3 includes a source terminal PS3, a drain terminal PD3, and a gate terminal PG3.

As shown in FIG. 2B, the gate terminals NG2 and PG2 are coupled with each other to operate as a first input terminal of the NAND 100B, and the gate terminals NG3 and PG3 are coupled with each other to operate as a second input terminal of the NAND 100B. The drain terminals ND2, PD2, and PD3 are coupled with each other to operate as an output terminal of the NAND 100B. In some embodiments, the connection of the drain terminals ND2, PD2, and PD3 are referred to as "common drain." The source terminals PS2 and PS3 are coupled to the VDD voltage. The source terminal NS3 is coupled to VSS voltage. The source terminal NS2 and drain terminal ND3 are coupled with each other.

FIG. 2C shows a NOR (also referred to as a NOR logic gate, a NOR device or a NOR cell) 100C including n-type transistors N4, N5 and P-type transistors P4, P5. The n-type transistor N4 includes a source terminal NS4, a drain terminal ND4, and a gate terminal NG4, and the n-type transistor N5 includes a source terminal NS5, a drain terminal ND5, and a gate terminal NG5. The P-type transistor P4 includes a source terminal PS4, a drain terminal PD4, and a gate terminal PG4, and the P-type transistor P5 includes a source terminal PS5, a drain terminal PD5, and a gate terminal PG5.

As shown in FIG. 2C, the gate terminals NG4 and PG4 are coupled with each other to operate as a first input terminal of the NOR 100C, and the gate terminals NG5 and PG5 are coupled with each other to operate as a second input terminal of the NOR 100C. The drain terminals ND4, ND5, and PD5 are coupled with each other to operate as an output terminal of the NOR 100C. In some embodiments, the connection of the drain terminals ND4, ND5, and PD5 are referred to as "common drain." The source terminal PS4 is coupled to the VDD voltage. The source terminals NS4 and NS5 are coupled to VSS voltage. The source terminal PS5 and drain terminal PD4 are coupled with each other.

Figure 2D:
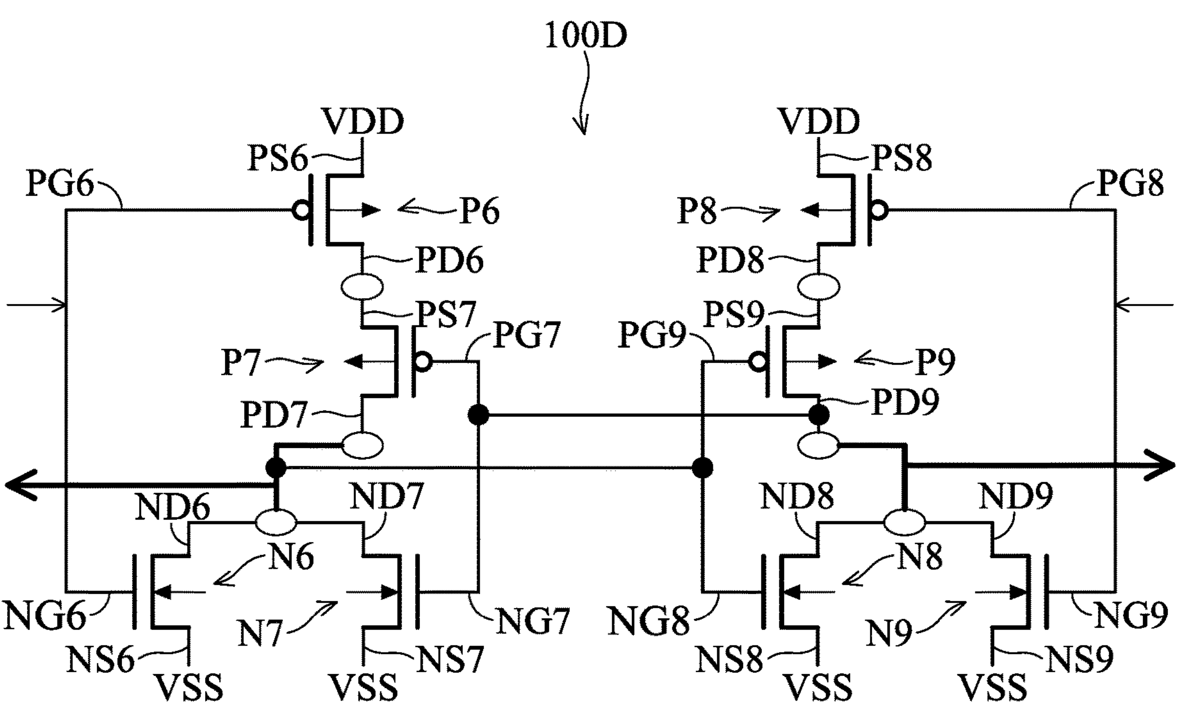

FIG. 2D shows a flip-flop (also referred to as a flip-flop device or a flip-flop cell) 100D including n-type transistors N6, N7, N8, N9 and P-type transistors P6, P7, P8, P9. The n-type transistor N6 includes a source terminal NS6, a drain terminal ND6, and a gate terminal NG6; the n-type transistor N7 includes a source terminal NS7, a drain terminal ND7, and a gate terminal NG7; the n-type transistor N8 includes a source terminal NS8, a drain terminal ND8, and a gate terminal NG8; and the n-type transistor N9 includes a source terminal NS9, a drain terminal ND9, and a gate terminal NG9. The P-type transistor P6 includes a source terminal PS6, a drain terminal PD6, and a gate terminal PG6; the P-type transistor P7 includes a source terminal PS7, a drain terminal PD7, and a gate terminal PG7; the P-type transistor P8 includes a source terminal PS8, a drain terminal PD8, and a gate terminal PG8; and the P-type transistor P9 includes a source terminal PS9, a drain terminal PD9, and a gate terminal PG9.

As shown in FIG. 2D, the flip-flop 100D is a set-reset (SR) NOR latch. The NOR latch may include a pair of cross-coupled NOR. Specifically, the output terminal of a first NOR is coupled to the second input terminal of a second NOR, and the output terminal of the second NOR is coupled to the second input terminal of the first NOR. The details of the other connections of the flip-flop 100D are similar to the NOR 100C, and may not be described in detail herein.

Figure 2E:
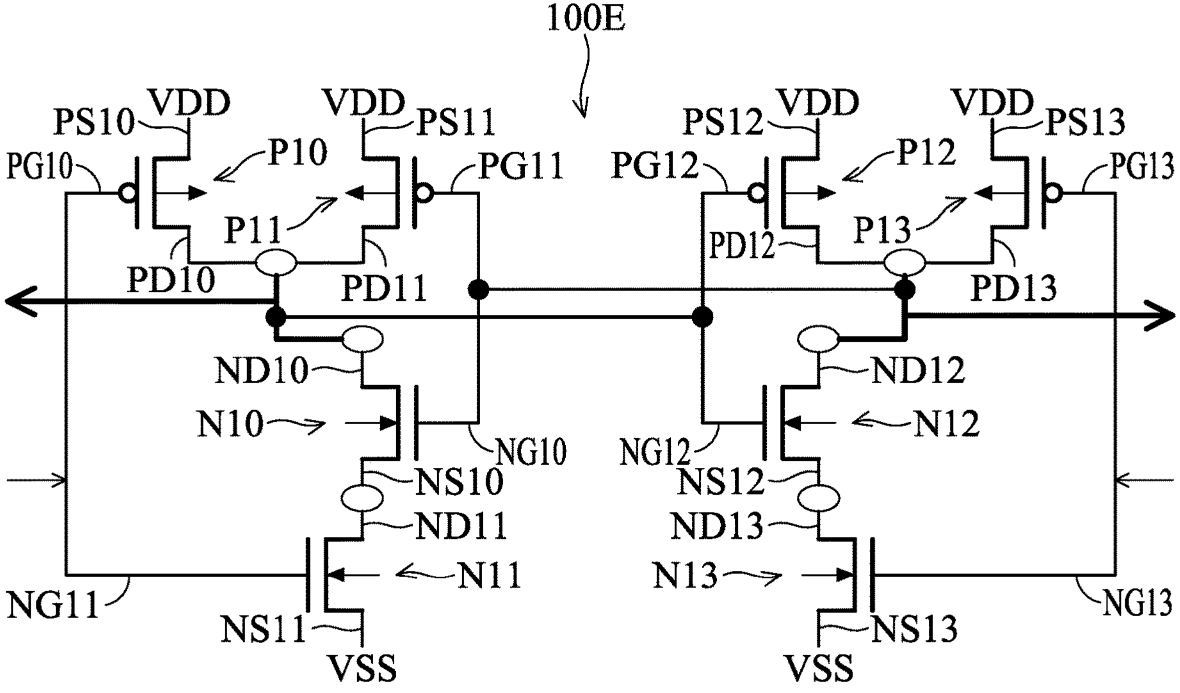

FIG. 2E shows a flip-flop 100E including n-type transistors N10, N11, N12, N13 and P-type transistors P10, P11, P12, P13. The n-type transistor N10 includes a source terminal NS10, a drain terminal ND10, and a gate terminal NG10; the n-type transistor N11 includes a source terminal NS11, a drain terminal ND11, and a gate terminal NG11; the n-type transistor N12 includes a source terminal NS12, a drain terminal ND12, and a gate terminal NG12; and the n-type transistor N13 includes a source terminal NS13, a drain terminal ND13, and a gate terminal NG13. The P-type transistor P10 includes a source terminal PS10, a drain terminal PD10, and a gate terminal PG10; the P-type transistor P11 includes a source terminal PS11, a drain terminal PD11, and a gate terminal PG11; the P-type transistor P12 includes a source terminal PS12, a drain terminal PD12, and a gate terminal PG12; and the P-type transistor P13 includes a source terminal PS13, a drain terminal PD13, and a gate terminal PG13.

As shown in FIG. 2E, the flip-flop 100E is a SR NAND latch. The NAND latch may include a pair of cross-coupled NAND. Specifically, the output terminal of a first NAND is coupled to the first input terminal of a second NAND, and the output terminal of the second NAND is coupled to the first input terminal of the first NAND. The details of the other connections of the flip-flop 100E are similar to the NAND 100B, and may not be described in detail herein.

Figure 3:
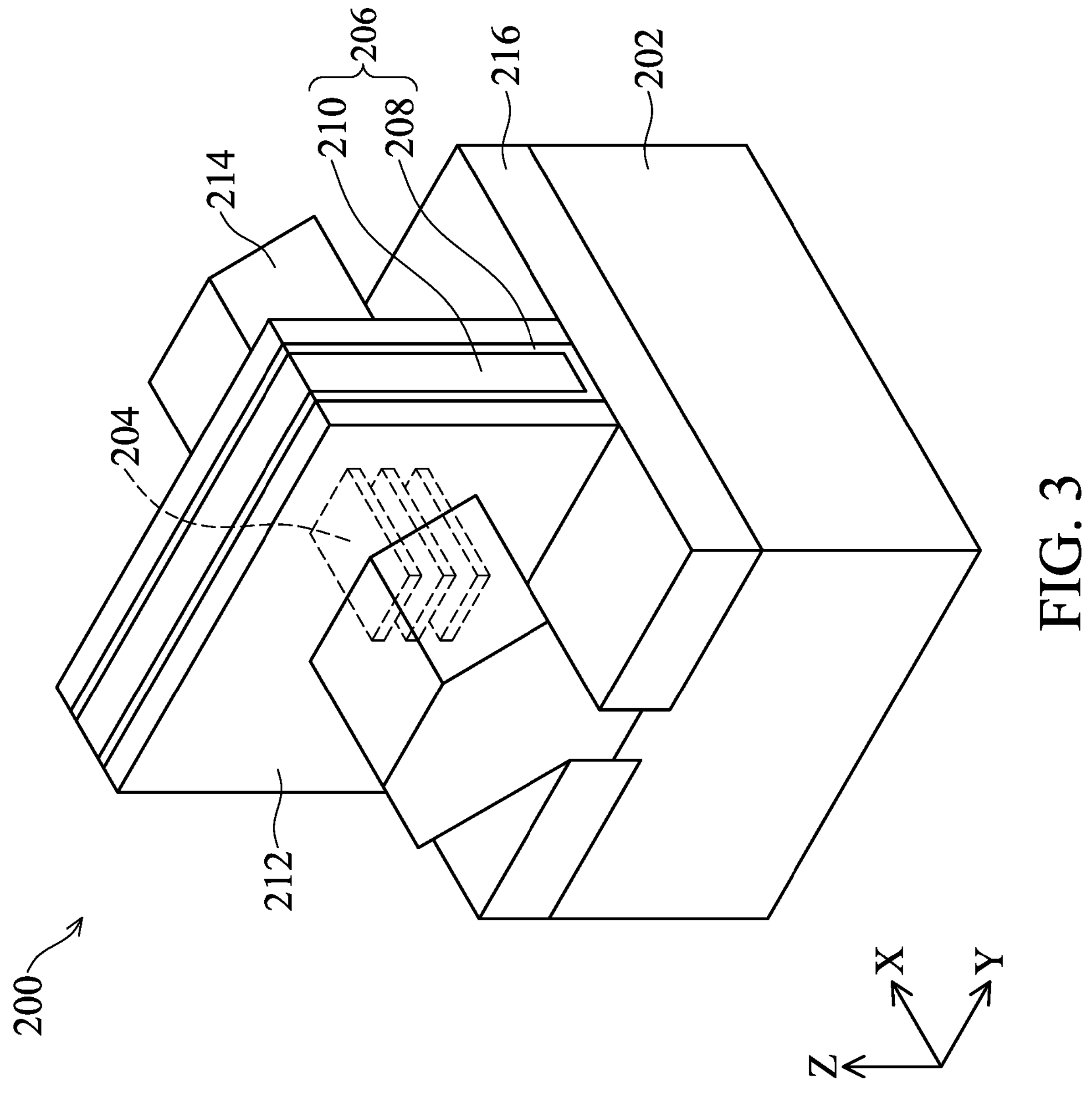
FIG. 3 is a perspective view of an embodiment of a GAA transistor in the array of circuit cells, in accordance with some embodiments of the present disclosure.

Each of the circuit cells discussed above is constructed by transistors. The transistors may be planar transistors, fin field-effect transistor (FinFET) transistors, gate-all-around (GAA) transistors, nano-wire transistors, nano-sheet transistors, or a combination thereof. For the sake of providing an example, an exemplary GAA transistor is illustrated in FIG. 3. However, it should be understood that the application should not be limited to a particular type of device, except as specifically claimed.

Referring to FIG. 3, a perspective view of an exemplary GAA transistor 200 is illustrated. The GAA transistor 200 is formed over a substrate 202. The substrate 202 may contains a semiconductor material, such as bulk silicon (Si). The GAA transistor 200 also includes one or more nanostructures 204 (dash lines) extending in an X-direction and vertically stacked (or arranged) in a Z-direction. More specifically, the nanostructures 204 are spaced from each other in the Z-direction. In some embodiments, the nanostructures 204 may also be referred to as channels, channel layers, nanosheets, or nanowires.

The GAA transistor 200 further includes a gate structure 206 including a gate dielectric layer 208 and a gate electrode 210. The gate dielectric layer 208 wraps around the nanostructures 204 and the gate electrode 210 wraps around the gate dielectric layer 208 (not shown in FIG. 2, may refer to FIGS. 4C and 4D). As shown in FIG. 2, gate spacers 212 are on sidewalls of the gate structure 206 and over the nanostructures 204 (not shown in FIG. 2, may refer to FIG. 4D)

The GAA transistor 200 further includes source/drain features 214. As shown in FIG. 2, two source/drain features 214 are on opposite sides of the gate structure 206. The nanostructures 204 (dash lines) extends in the X-direction to connect one source/drain feature 214 to the other source/drain feature 214. The source/drain features 214 may also be referred to as source/drain, or source/drain regions. In some embodiments, source/drain feature(s) may refer to a source or a drain, individually or collectively dependent upon the context.

Isolation feature 216 is over the substrate 202 and under the gate dielectric layer 208, the gate electrode 210, and the gate spacers 212. The isolation feature 216 is used for isolating the GAA transistor 200 from other devices. In some embodiments, the isolation feature 216 may include different structures, such as shallow trench isolation (STI) structure, deep trench isolation (DTI) structure. Therefore, the isolation feature 216 is also referred as to as a STI feature or DTI feature.

Figure 4A:
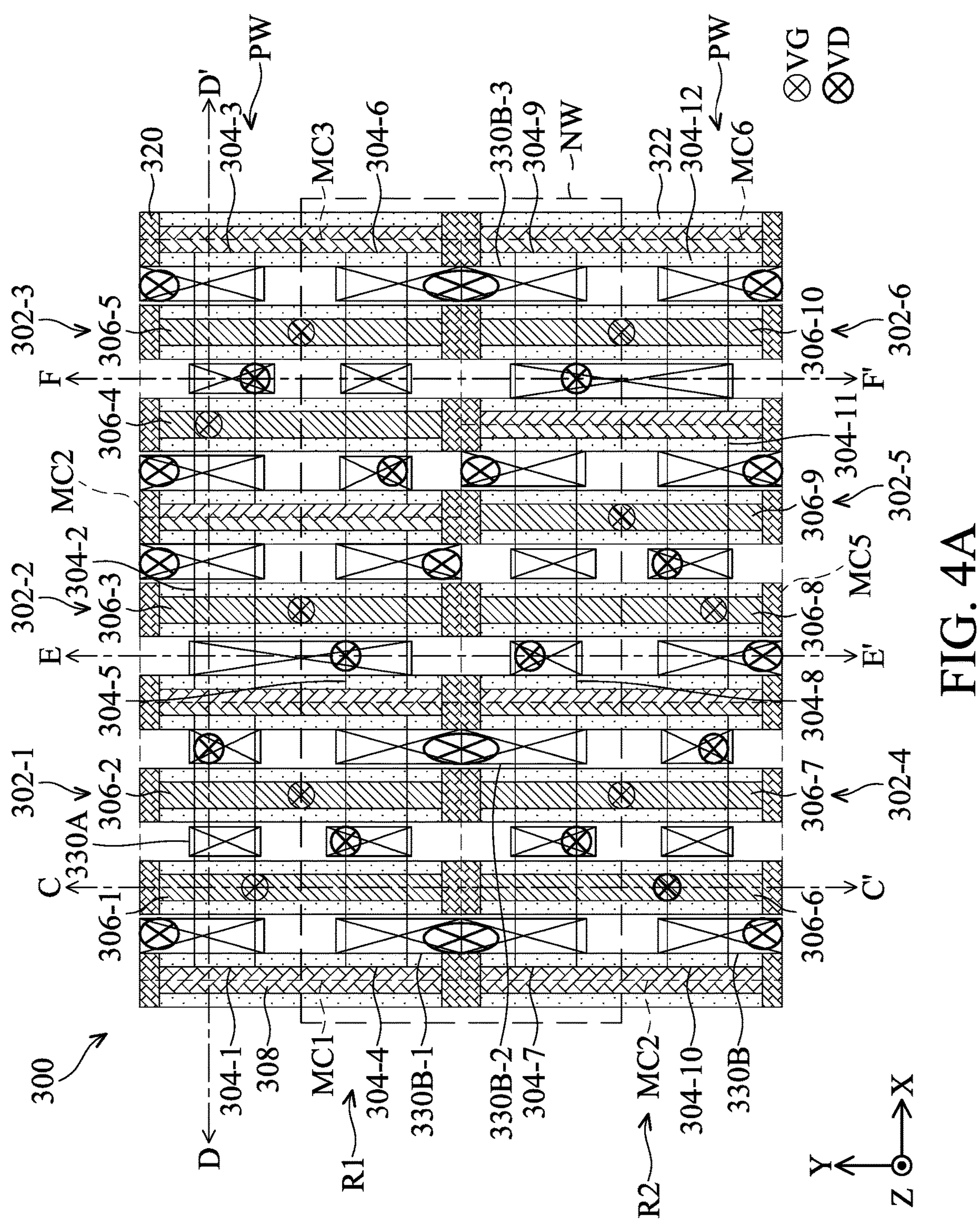
FIGS. 4A and 4B illustrate fragmentary diagrammatic top views of an array of circuit cells in the logic region of the IC chip, in accordance with some embodiments of the present disclosure.
Figure 4B:
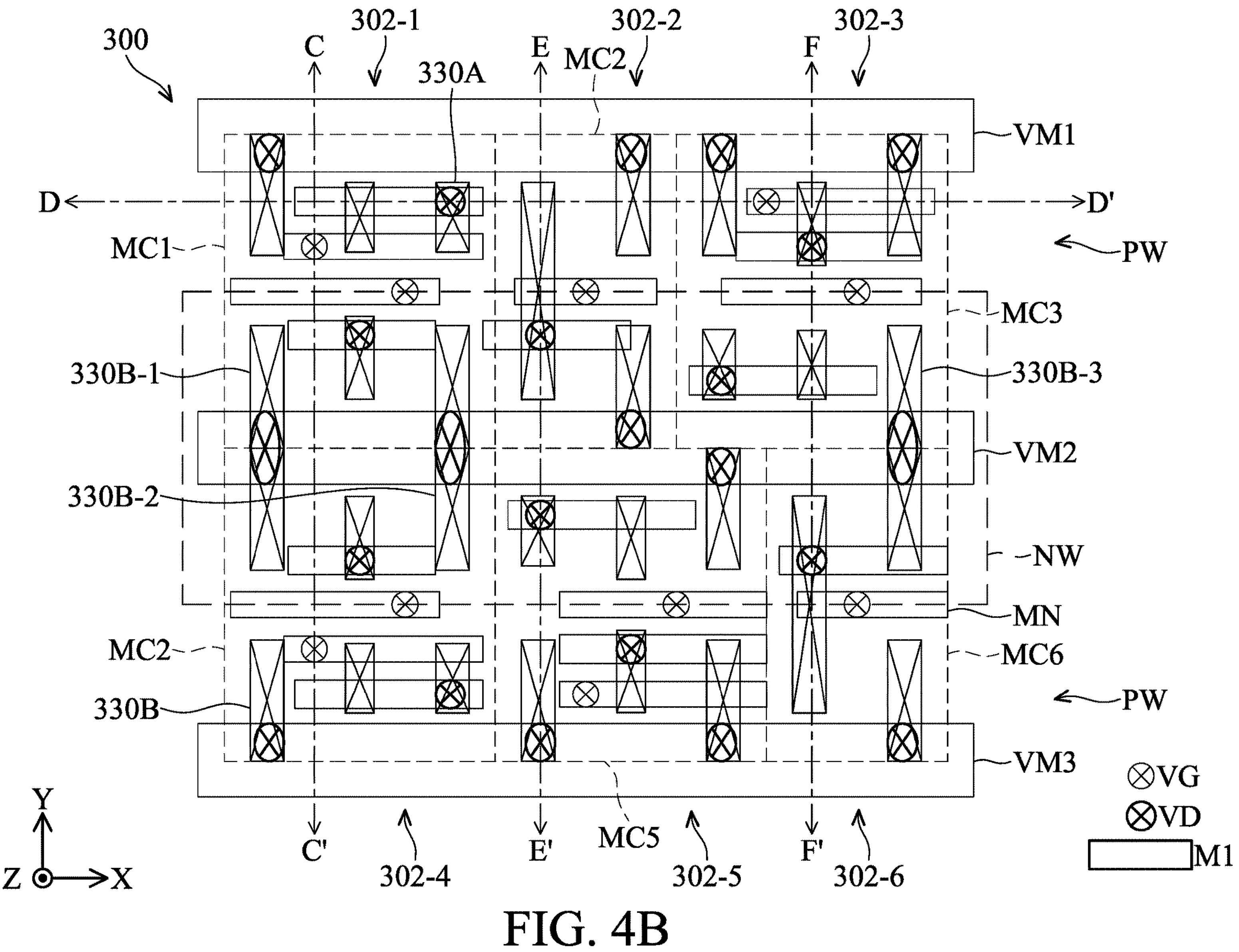

FIGS. 4A and 4B illustrate fragmentary diagrammatic top views (or layouts) of an array 300 of circuit cells in the logic region 20 of the IC chip 10, in accordance with some embodiments of the present disclosure. FIG. 4A illustrates features of transistors and vias connected to contact features and/or gate structures of the transistors, and FIG. 4B illustrates the contact features of the transistors, the vias, and metal lines.

Figure 4C:
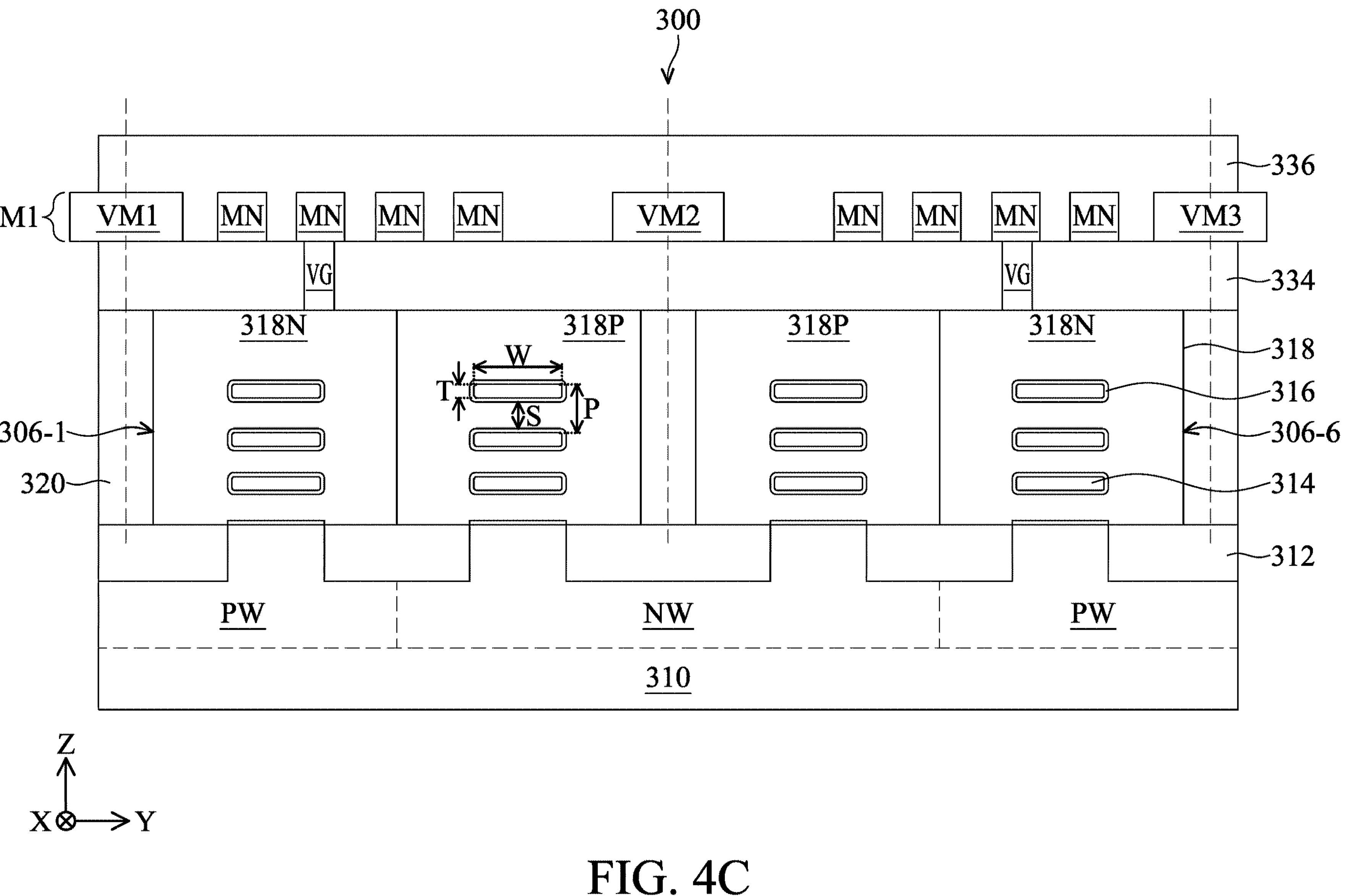
FIG. 4C illustrates a cross sectional view of the array of the circuit cells along a line C-C' in FIGS. 4A and 4B, in accordance with some embodiments of the present disclosure.
Figure 4D:
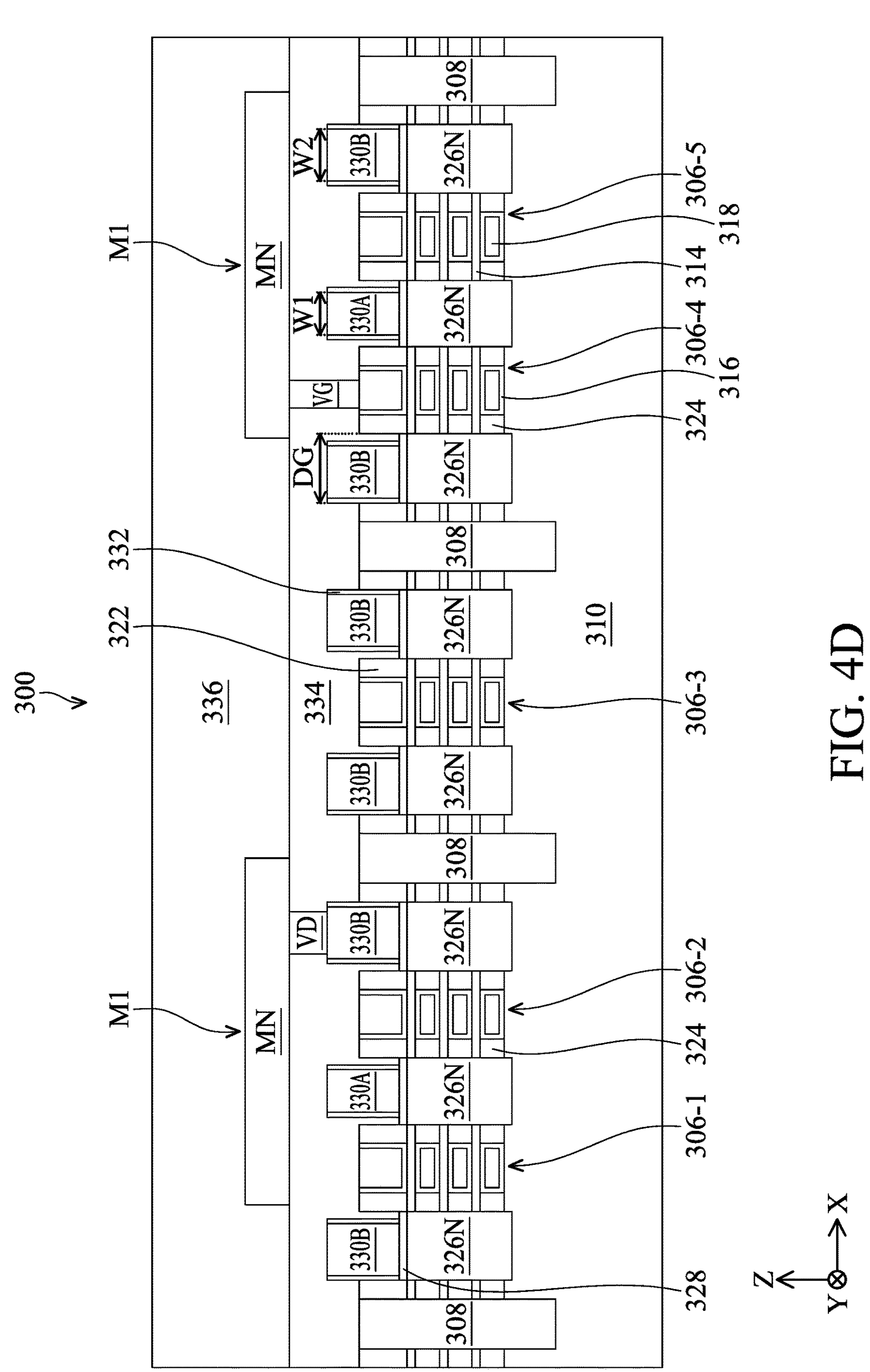
FIG. 4D illustrates a cross sectional view of the array of the circuit cells along a line D-D' in FIGS. 4A and 4B, in accordance with some embodiments of the present disclosure.
Figure 4E:
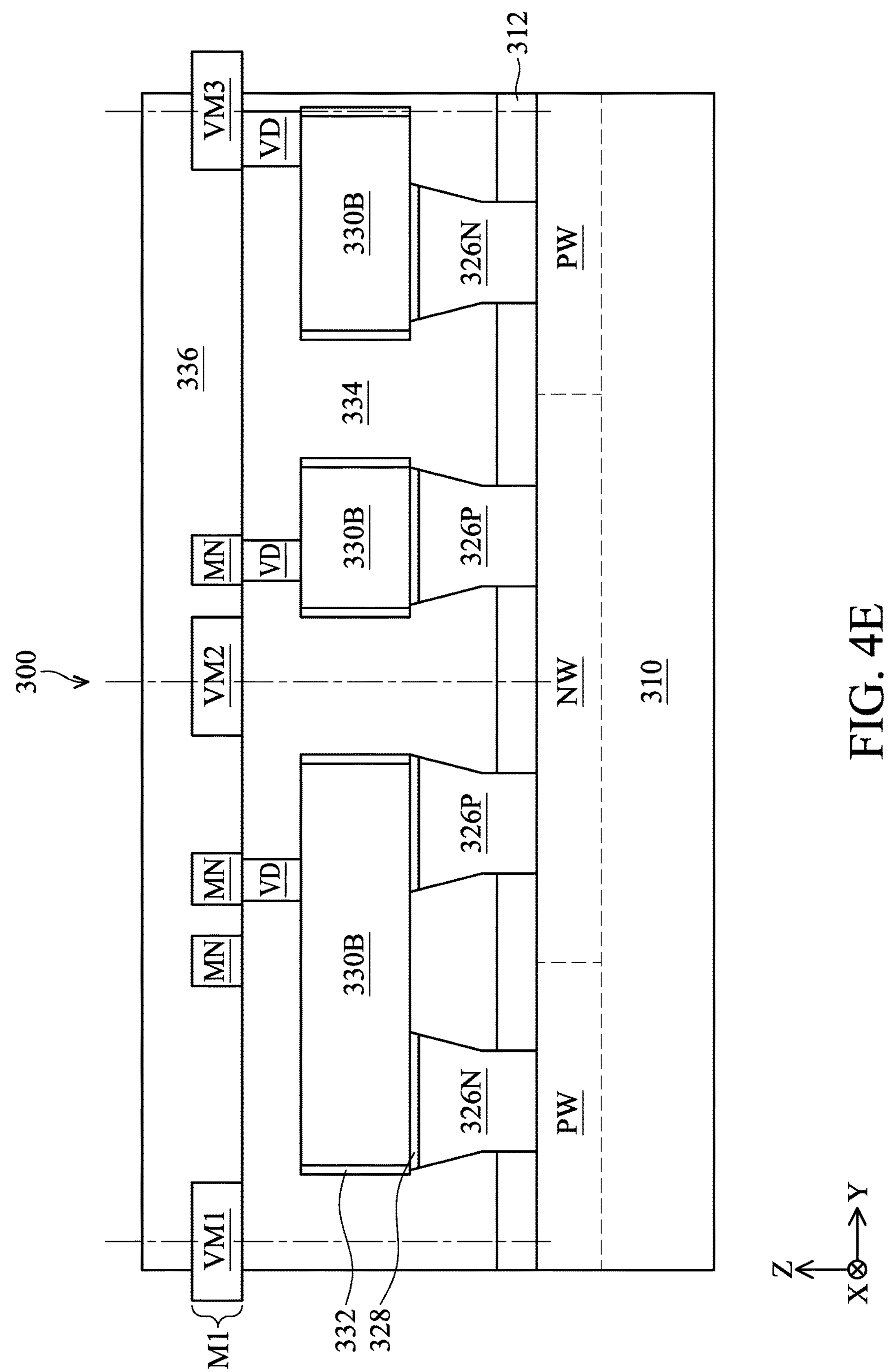
FIG. 4E illustrates a cross sectional view of the array of the circuit cells along a line E-E' in FIGS. 4A and 4B, in accordance with some embodiments of the present disclosure.
Figure 4F:
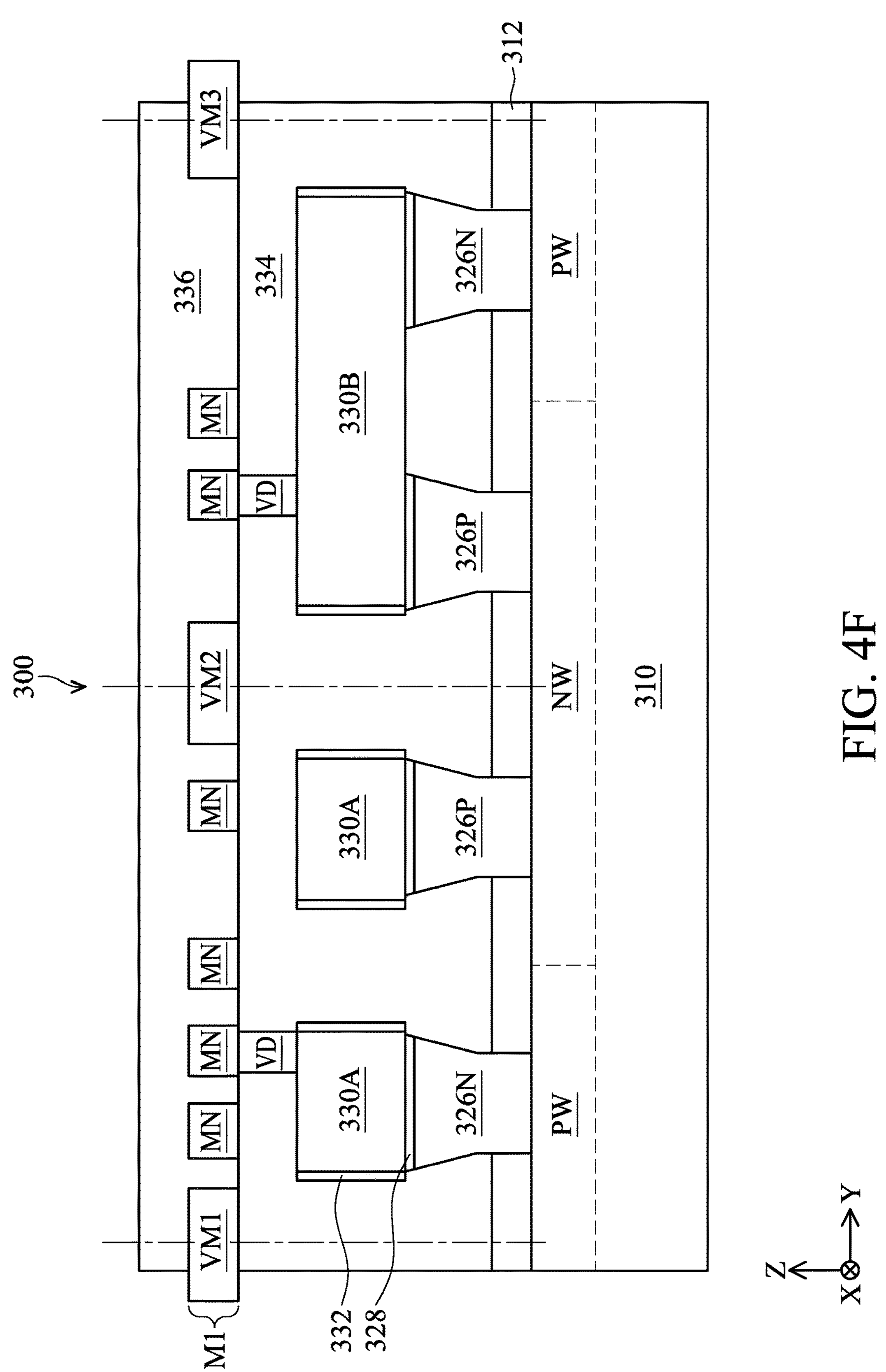
FIG. 4F illustrates a cross sectional view of the array of the circuit cells along a line F-F' in FIGS. 4A and 4B, in accordance with some embodiments of the present disclosure.

FIG. 4C illustrates a cross sectional view of the array 300 of the circuit cells along a line C-C' in FIGS. 4A and 4B, in accordance with some embodiments of the present disclosure. FIG. 4D illustrates a cross sectional view of the array 300 of the circuit cells along a line D-D' in FIGS. 4A and 4B, in accordance with some embodiments of the present disclosure. FIG. 4E illustrates a cross sectional view of the array 300 of the circuit cells along a line E-E' in FIGS. 4A and 4B, in accordance with some embodiments of the present disclosure. FIG. 4F illustrates a cross sectional view of the array 300 of the circuit cells along a line F-F' in FIGS. 4A and 4B, in accordance with some embodiments of the present disclosure.

The array 300 may include circuit cells, for example standard circuit cells (also referred to STD cells). As discussed above, the STD cells may include logic circuits or logic devices, including but not limited to logic circuits such as inverters, NANDs, NORs, flip-flops, or a combination thereof. For the sake of providing an example, the array 300 shows a row R1 having circuit cell 302-1 (which includes a NAND) with a cell boundary MC1, circuit cell 302-2 (which includes an inverter) with a cell boundary MC2, and circuit cell 302-3 (which includes an NOR) with a cell boundary MC3; and a row R2 having circuit cell 302-4 (which includes a NAND) with a cell boundary MC4, circuit cell 302-5 (which includes an NOR) with a cell boundary MC5, and circuit cell 302-6 (which includes an inverter) with a cell boundary MC6. It should be understood that the circuit cells 302-1 to 302-6 are merely examples. The present disclosure applies to other types of STD cells as well, for example cells including NORs, ANDs, ORs, flip-flops, or a combination thereof.

The array 300 includes active areas, such as active areas 304-1 to 304-12, (may be collectively referred to as the active areas 304) that extend lengthwise in the X-direction. Each of active areas 304 includes channel regions, source regions, and drain regions (where source regions and drain regions are collectively referred to as source/drain regions herein) of transistors (e.g., the GAA transistor 200) of the array 300. The active areas 304-4 to 304-9 are disposed over an n-type well (or N-Well) NW. The active areas 304-1 to 304-3 and 304-10 to 304-12 are disposed over p-type wells (or P-Wells) PW that are on both sides of the n-type well NW in the Y-direction.

The array 300 further includes gate structures, such as gate structures 306-1 to 306-10 (may be collectively referred to as the gate structures 306). The gate structures 306-1 to 306-10 extend substantially parallel to one another, extend lengthwise in the Y-direction perpendicular to the X-direction, and are separated from each other in the X-direction. The gate structures 306-1 to 306-10 are disposed over the channel regions of the respective active areas 304-1 to 304-12 (i.e., the (vertically stacked) nanostructures) and disposed between respective source/drain regions of the active areas 304-1 to 304-12 (i.e., p-type source/drain features and/or n-type source/drain features, respectively). In some embodiments, gate structures 306-1 to 306-10 wrap and/or surround suspended, vertically stacked nanostructures in the channel regions of the active areas 304-4 to 304-9, respectively (as shown in FIG. 4C).

The active areas 304-4 to 304-9 and the gate structures 306-1 to 306-10 are configured to provide each of circuit cells 302-1 to 302-6 with transistors. In the circuit cell 302-1, the gate structure 306-1 engages the active area 304-1 to construct a transistor similar to the n-type transistor N3 of the NAND 100B discussed above, the gate structure 306-1 engages the active area 304-4 to construct a transistor similar to the p-type transistor P3 of the NAND 100B discussed above, the gate structure 306-2 engages the active area 304-1 to construct a transistor similar to the n-type transistor N2 of the NAND 100B discussed above, and the gate structure 306-2 engages the active area 304-4 to construct a transistor similar to the p-type transistor P2 of the NAND 100B discussed above.

In the circuit cell 302-2, the gate structure 306-3 engages the active area 304-2 to construct a transistor similar to the n-type transistor N1 of the inverter 100A discussed above, and the gate structure 306-3 engages the active area 304-5 to construct a transistor similar to the p-type transistor P1 of the inverter 100A discussed above.

In the circuit cell 302-3, the gate structure 306-4 engages the active area 304-3 to construct a transistor similar to the n-type transistor N5 of the NOR 100C discussed above, the gate structure 306-4 engages the active area 304-6 to construct a transistor similar to the p-type transistor P5 of the NOR 100C discussed above, the gate structure 306-5 engages the active area 304-3 to construct a transistor similar to the n-type transistor N4 of the NOR 100C discussed above, and the gate structure 306-5 engages the active area 304-6 to construct a transistor similar to the p-type transistor P4 of the NOR 100C discussed above.

In the circuit cell 302-4, the gate structure 306-6 engages the active area 304-7 to construct a transistor similar to the p-type transistor P3 of the NAND 100B discussed above, the gate structure 306-6 engages the active area 304-10 to construct a transistor similar to the n-type transistor N3 of the NAND 100B discussed above, the gate structure 306-7 engages the active area 304-7 to construct a transistor similar to the p-type transistor P2 of the NAND 100B discussed above, and the gate structure 306-7 engages the active area 304-10 to construct a transistor similar to the n-type transistor N2 of the NAND 100B discussed above.

In the circuit cell 302-5, the gate structure 306-8 engages the active area 304-8 to construct a transistor similar to the p-type transistor P5 of the NOR 100C discussed above, the gate structure 306-8 engages the active area 304-11 to construct a transistor similar to the n-type transistor N5 of the NOR 100C discussed above, the gate structure 306-9 engages the active area 304-8 to construct a transistor similar to the p-type transistor P4 of the NOR 100C discussed above, and the gate structure 306-9 engages the active area 304-11 to construct a transistor similar to the n-type transistor N4 of the NOR 100C discussed above.

In the circuit cell 302-6, the gate structure 306-10 engages the active area 304-9 to construct a transistor similar to the p-type transistor P1 of the inverter 100A discussed above, and the gate structure 306-10 engages the active area 304-12 to construct a transistor similar to the n-type transistor N1 of the inverter 100A discussed above.

The array 300 further includes dielectric gate structures 308 for separating the circuit cells 302-1 to 302-6 from each other. The dielectric gate structures 308 extend lengthwise in the Y-direction. The dielectric gate structures 308 and the circuit cells 302-1 to 302-6 (or the gate structures 306-1 to 306-10) are arranged in the X-direction. More specifically, in the row R1 of the array 300, four dielectric gate structures 308 and the circuit cells 302-1 to 302-3 (or the gate structures 306-1 to 306-5) are arranged in the X-direction, and four dielectric gate structures 308 separate or isolate the circuit cells 302-1 to 302-3 from each other. Similarly, in the row R2 of the array 300, four dielectric gate structures 308 and the circuit cells 302-4 to 302-3 (or the gate structures 306-1 to 306-5) are arranged in the X-direction, and four dielectric gate structures 308 separate or isolate the circuit cells 302-1 to 302-3 from each other.

Referring to FIGS. 4C to 4F, The array 300 includes a substrate 310, over which the various features are formed, such as the gate structures 306 and dielectric gate structures 308 above. The substrate 310 may contains a semiconductor material, such as bulk silicon (Si). In some other embodiments, the substrate 310 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). Alternatively, the substrate 310 may be a semiconductor-on-insulator substrate, such as a silicon-on-insulator (SOI) substrate, a silicon germanium-on-insulator (SGOI) substrate, or a germanium-on-insulator (G01) substrate. Semiconductor-on-insulator substrates may be fabricated using separation by implantation of oxygen (SIMOX), wafer bonding, and/or other suitable methods.

The n-type well NW and p-type wells PW are formed in or on the substrate 310, as shown in FIGS. 4C, 4E, and 4F. In the present embodiment, the p-type wells PW are p-type doped regions configured for n-type transistors, and the n-type well NW are n-type doped regions configured for p-type transistors. The n-type well NW is doped with n-type dopants, such as phosphorus, arsenic, other n-type dopant, or combinations thereof. The p-type wells PW are doped with p-type dopants, such as boron, indium, other p-type dopant, or combinations thereof. In some implementations, the substrate 310 includes doped regions formed with a combination of p-type dopants and n-type dopants. The various n-type wells and/or p-type wells can be formed directly on and/or in the substrate 310, for example, providing a p-well structure, an n-well structure, a dual-well structure, a raised structure, or combinations thereof. An ion implantation process, a diffusion process, and/or other suitable doping process can be performed to form the various wells.

Similar to the isolation feature 216 discussed above, the array 300 further includes an isolation feature (or isolation structure) 312 over the substrate 310 and isolating the adjacent active areas 304. The isolation feature 312 may include silicon oxide, silicon nitride, silicon oxynitride, other suitable isolation material (for example, including silicon, oxygen, nitrogen, carbon, or other suitable isolation constituent), or combinations thereof. The isolation feature 312 may include different structures, such as shallow trench isolation (STI) structures, deep trench isolation (DTI) structures, and/or local oxidation of silicon (LOCOS) structures. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Each of the transistors in the circuit cells 302-1 to 302-6 includes nanostructures 314 similar to the nanostructures 204 discussed above. As shown in FIGS. 4C and 4D, the nanostructures 314 are suspended over the n-type well NW and p-type wells PW. In some embodiments, three nanostructures 314 are vertically stacked (or vertically arranged) from each other in the Z-direction for one transistor. However, there may be another appropriate number of nanostructures in one transistor. For example, there may be from 2 to 10 nanostructures 314 in one transistor. The nanostructures 314 further extend lengthwise in the X-direction (FIGS. 4A and 4D) and widthwise in the Y-direction (FIG. 4C). In some embodiments, each of the nanostructures 314 has a width W in the Y-direction and in a range from about 4 nm to about 70 nm, as shown in FIG. 4C. In some embodiments, each of the nanostructures 314 has a thickness Tin the Z-direction and in a range from about 4 nm to about 10 nm, as shown in FIG. 4C. As shown in FIG. 4C, in each of the transistors in the circuit cells 302-1 to 302-6, three nanostructures 314 are spaced from each other in the Z-direction by a distance S in a range from about 6 nm to about 20 nm. In some embodiments, the nanostructures has vertically a pitch P in the Z-direction and in a range from about 10 nm to about 30 nm. The nanostructures 314 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 314 include silicon for n-type transistors. In other embodiments, the nanostructures 314 include silicon germanium for p-type transistors. In some embodiments, the nanostructures 314 are all made of silicon, and the type of the transistors depend on work function metal layer wrapping around the nanostructures 314. In some embodiments, the nanostructures 314 are epitaxially grown using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized.

The gate structures 306-1 to 306-10 each has a gate dielectric layer 316 and a gate electrode layer 318. The gate dielectric layers 316 wrap around each of the nanostructures 314 and the gate electrodes layer 318 wrap around the gate dielectric layer 316. In some embodiments, the gate structures 306 each further includes an interfacial layer (such as having silicon dioxide, silicon oxynitride, or other suitable materials) between the gate dielectric layer 316 and the nanostructures 314. The gate dielectric layer 316 has a thickness in a range from about 0.5 nm to about 3 nm. The gate dielectric layers 316 may include oxide with nitrogen doped dielectric material (initial layer) combined with metal content high-K dielectric material (K value (dielectric constant)>13). For example, gate dielectric layers 316 may include hafnium oxide ($HfO_2$), which has a dielectric constant in a range from about 18 to about 40. Alternatively, the gate dielectric layers 316 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, $HfTa_0$, HfTiO, (Ba,Sr)$TiO_3$ (BST), $Al_2O_3$, $Si_3N_4$, oxynitrides (SiON), combinations thereof, or other suitable material. The gate dielectric layers 316 may be formed by chemical oxidation, thermal oxidation, ALD, CVD, and/or other suitable methods.

The gate electrode layer 318 is formed to wrap around the gate dielectric layer 316 and the center portions of the nanostructures 314, as shown in FIGS. 4C and 4D. In some embodiments, the gate electrode layer 318 may include an n-type work function metal layer 318N for n-type transistor or a p-type work function metal layer 318P for p-type transistor. In an embodiment the n-type work function metal layer 318N is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the n-type work function metal layer 318N may be deposited utilizing ALD, CVD, or the like. However, any suitable materials and processes may be utilized to form the n-type work function metal layer 318N. In an embodiment, the p-type work function metal layer 318P may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-type work function metal layer 318P may be deposited using a deposition process such as ALD, CVD, or the like, although any suitable deposition process may be used.

The gate electrode layer 318 may include a single layer or alternatively a multi-layer structure. In some embodiments, the gate electrode layer 318 may further include a capping layer, a barrier layer, and a fill material (not shown). The capping layer may be formed adjacent to the gate dielectric layers 316 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used. The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

As discussed above, the dielectric gate structures 308 extend lengthwise in the Y-direction (e.g., parallel to the gate structures 306) to separate the circuit cells 302-1 to 302-6 from each other, as show in FIGS. 4A and 4D. Unlike the gate structures 306, however, the dielectric gate structures 308 are not functional gate structures (e.g., do not contain the gate dielectric layer 316 and the gate electrode layer 318). Instead, the dielectric gate structures 308 may be made of electrically insulating materials (e.g., dielectric materials) to provide electrical isolation between various circuit cells. In some embodiments, the dielectric gate structures 308 may be single dielectric layer or multiple layers and selected from a group consisting of $SiO_2$, SiOC, SiON, SiOCN, carbon content oxide, nitrogen content oxide, carbon and nitrogen content oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, or combinations thereof.

As discussed above, the dielectric gate structures 308 and the gate structures 306 are arranged in the X-direction. In same row (the row R1 or R2) of the array 300, a gate pitch of the gate structures 306 and a gate pitch of one gate structure 306 to one dielectric gate structure 308 are substantially the same. Furthermore, a gate length of the gate structures 306 in the X-direction and a gate length of the dielectric gate structures 308 in the X-direction are the same. In some embodiments, the gate length of the gate structures 306 is in a range from about 4 nm to about 25 nm.

As shown in FIGS. 4A and 4C, gate end dielectrics 320 are at ends of the gate structures 306 and the dielectric gate structures 308. The gate end dielectrics 320 are used for separating the gate structures 320 and/or the dielectric gate structures 308 aligned in the Y-direction. For example, the gate end dielectrics 320 separate the gate structures 306-1 and 306-6, as shown in FIG. 4C. In some embodiments, the gate end dielectrics 320 also separate the gate structures 306 and/or the dielectric gate structures 308 from gate structures and/or dielectric gate structures of other circuit cells (not shown) in other rows of the array 300. The material of the gate end dielectrics 320 is selected from a group consisting of $Si_3N_4$, nitride-base dielectric, carbon-base dielectric, high K material (K>=9), or a combination thereof.

The gate spacers 322 are on sidewalls of the gate structures 306 and the dielectric gate structures 308, and over the nanostructures 314, as shown in FIG. 4D. The gate spacers 322 are over the nanostructures 314 and on top sidewalls of the gate structures 322 and the dielectric gate structures 308, and thus are also referred to as gate top spacers or top spacers. The gate spacers 322 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 322 may include a single layer or a multi-layer structure.

As shown in FIG. 4D, the array 300 further includes inner spacers 324 on the sidewalls of the gate structures 306 and the dielectric gate structures 308, and below the topmost nanostructures 314. Furthermore, the inner spacers 324 are laterally between the source/drain features 326N (or 326P) and the gate structures 306 and between the source/drain features 326N (or 326P) and the dielectric gate structures 308. The inner spacers 324 are also vertically between adjacent nanostructures 314 and between bottommost nanostructures 314 and the substrate 310. The inner spacers 324 may include a dielectric material having higher K value (dielectric constant) than the gate spacers 322 and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof. In some embodiments, the gate spacers 322 have a thickness in the X-direction and in a range from about 4 nm to about 12 nm, and the inner spacers 324 have a thickness in the X-direction and in a range from about 4 nm to about 12 nm. In some embodiments, the thickness of the gate spacers 322 in the X-direction and the thickness of the inner spacers 324 in the X-direction are the same. In other embodiments, the thickness of the gate spacers 322 in the X-direction is less than the thickness of the inner spacers 324 in the X-direction due to the gate spacers 322 are trimmed during sequent processes for forming source/drain contacts.

Referring to FIGS. 4D to 4F, the array 300 further includes source/drain features 326N and source/drain features 326P over the substrate 310 and in the source/drain regions of the active areas 304. More specifically, the source/drain features 326N and the source/drain features 326P are respectively disposed between the two respective gate structures 306 or one respective gate structure 306 and one respective dielectric gate structure 308. The source/drain features 326N are disposed over both sides of the respective gate structure 306 and connected by the nanostructures 314 to form n-type transistor. Similarly, the source/drain features 326P are disposed over both sides of the respective gate structure 306 and connected by the nanostructures 314 to form p-type transistor. As shown in FIG. 4D, the dielectric gate structure 308 has a depth that deeper than the source/drain features 326N and 326P at least about 20 nm.

The source/drain features 326N and 326P may be formed by using epitaxial growth. In some embodiments, the source/drain features 326N may include epitaxially-grown material selected from a group consisting of SiP, SiC, SiPC, SiAs, Si, or a combination thereof. In some embodiments, the epitaxially-grown material of the source/drain features 326N may be doped with phosphorus (or arsenic, or both) having a doping concentration in a range from about $2\times10^9/cm^3$ to $3\times10^{21}/cm^3$. In some embodiments, the source/drain features 326P may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 326P may be doped with boron having a doping concentration in a range from about $1\times10^{19}/cm^3$ to $6\times10^{20}/cm^3$.

As shown in FIGS. 4D to 4F, the array 300 further includes silicide features 328 over the source/drain features 326N and 326P. The silicide features 328 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Referring to FIGS. 4A, 4B, 4D, 4E, and 4F, the array 300 further includes two types of source/drain contacts, source/drain contacts 330A and source/drain contacts 330B, over and electrically connected to the source/drain features 326N and 326P. The source/drain contacts 330A and 330B extend in the Y-direction. The source/drain contacts 330A and 330B are non-self-aligned source/drain contacts. This means that the source/drain contacts 330A and 330B are not formed by using the gate spacers 322 as mask. In the present embodiment, the width W1 of the source/drain contacts 330A and the width W2 of the source/drain contacts 330B in the X-direction are less than the distance DG between two gate spacers 322 respectively on sidewalls of two adjacent gate structures 306 (or an adjacent gate structure 306 and a dielectric gate structure 308), as shown in FIG. 4D. In some embodiments, the width W1 of the source/drain contacts 330A and the width W2 of the source/drain contacts 330B are less than the width of the source/drain features 326N and 326P. In some embodiments, the source/drain contacts 330B which electrically connected to power conductor (discussed in below) extend in the Y-direction to overlap the cell boundaries (e.g., the cell boundaries MC1 to MC6 discussed above) of the circuit cells in a top view, as shown in FIGS. 4A and 4B.

The source/drain contacts 330B further have source/drain contacts 330B-1, 330B-2, and 330B-3. As shown in FIGS. 4A and 4B, each of the source/drain contacts 330B-1, 330B-2, and 330B-3 are shared by the circuit cells in adjacent two rows of the array 300. The source/drain contacts 330B-1, 330B-2 are shared by the circuit cell 302-1 in the row R1 and the circuit cell 302-4 in the row R2; and the source/drain contact 330B-3 is shared by the circuit cell 302-3 in the row R1 and the circuit cell 302-6 in the row R2. Therefore, the source/drain contacts 330B-1, 330B-2, and 330B-3 may also be referred to as shared source/drain contacts.

In existing technologies, self-aligned source/drain contacts are used. However, as transistors and circuit cells continue to be scaled down, the self-aligned source/drain contact impact the isolation margin. The transistors with the self-aligned source/drain contact have a larger contact-to-gate parasitic capacitance and the current easily breaks down from contact to gate. In some embodiments of the present disclosure, the source/drain contacts 330A and 330B are non-self-aligned source/drain contacts. For example, the source/drain contacts 330A and 330B are separated from the gate spacers 322 on the sidewalls of the gate structures 306 rather than in contact with the gate spacers 322 on the sidewalls of the gate structures 306 (which in the case of self-aligned source/drain contacts), as show in FIGS. 4A and 4D. In other words, the distance from the source/drain contacts 330A and 330B to the gate structures 306 is greater than that of the self-aligned source/drain contacts. Therefore, the transistors in the array 300 have a lower contact-to-gate parasitic capacitance and makes it is hard for the current to break down from contact to gate, thereby improving the performance of the array 300.

Furthermore, each of the source/drain contacts 330A is between adjacent two of the gate structures 306, and each of the source/drain contacts 330B is between adjacent one of the gate structures 306 and one of the dielectric gate structures 308. As such, the source/drain contacts 330B may have a larger width W2 in the X-direction. Furthermore, each of the source/drain contacts 330B is closer to a dielectric gate structure 308 than it is to a gate structure 306. More specifically, a distance from the source/drain contact 330B to the gate structure 306 is greater than a distance from the second source/drain contact 330B to the dielectric gate structure 308. This is because the dielectric gate structures 308 are not functional gate structures, so that the source/drain contacts 330B may have a larger width W2 and extend toward the dielectric gate structures 308 without impacting the isolation margin and maintaining the reliability margin between contacts and gate structures. Therefore, the source/drain contacts 330B may have a larger contact size to have less resistance.

As shown in FIGS. 4A and 4D, the width W2 of the source/drain contacts 330B is greater than the width W1 of the source/drain contacts 330A. In some embodiments, a ratio of the width W2 of the source/drain contacts 330B to the width W1 of the source/drain contacts 330A is in a range from about 1.05 to about 1.25. In some embodiments, the width W1 of the source/drain contacts 330A is in a range from about 6 nm to about 30 nm and the width W2 of the source/drain contacts 330B is in a range from about 6 nm to about 30 nm. The source/drain contacts 330A and 330B may each include a conductive material such as Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 330A and 330B may each include single conductive material layer or multiple conductive layers.

Referring to FIGS. 4D, 4E, and 4F, the array 300 further includes contact sidewall layers 332 on sidewalls of the source/drain contacts 330A and 330B. More specifically, the contact sidewall layers 332 fully surround (sidewalls of) the source/drain contacts 330A and 330B. The contact sidewall layers 332 each has a thickness in the X-direction or Y-direction and in a range from about 0.3 nm to about 2 nm. In some embodiments, the contact sidewall layers 332 include dielectric material having nitrogen-content, and the dielectric material selected from a group consist of $Si_3N_4$, SiON, SiOC, SiOCN, or a combination thereof. The contact sidewall layers 332 may further improve the isolation margin for the source/drain contacts 330A and 330B to the gate structures 306.

In some embodiments, the contact sidewall layers 332 on the sidewalls of the source/drain contacts 330B are in contact with the gate spacers 322 on the sidewalls of the dielectric gate structure 308, as shown in FIG. 4D. For forming such contact sidewall layers 332 in contact with the gate spacers 322 on the sidewalls of the dielectric gate structure 308, the gate spacers 322 on the sidewalls of the dielectric gate structure 308 may be trimmed during the forming processes. Therefore, the thickness of the gate spacers 322 (on the sidewalls of the dielectric gate structure 308) in the X-direction is less than the thickness of the inner spacers 324 in the X-direction, as discussed above. In other embodiments, the contact sidewall layers 332 on the sidewalls of the source/drain contacts 330B separated from the gate spacers 322 on the sidewalls of the dielectric gate structure 308. The contact sidewall layers 332 are optional (will show in below) and the sidewalls of the source/drain contacts 330B may be in contact with or separated from the gate spacers 322 on the sidewalls of the dielectric gate structure 308 without the contact sidewall layers 332, in some embodiments.

Referring to FIGS. 4C to 4F, the array 300 further includes inter-layer dielectric (ILD) layer 334 over the substrate 310, the isolation feature 312, the gate structures 306, and the dielectric gate structure 308, between the source/drain features 326N/326P, and between the source/drain contacts 330A/330B, and includes an inter-metal dielectric (IMD) layer 336 over the ILD layer 334, the gate structures 306, the dielectric gate structure 308, and the source/drain contacts 330A/330B.

It is noted that the gate structures 306 are in direct contact with the ILD layer 334. For examples, top surfaces of the gate structures 306 are in direct contact with the ILD layer 334, as shown in FIG. 4D. This means that no additional hard mask layers or dielectric layers are formed over the gate structures 306 to separate from the ILD layer 334. This is because the source/drain contacts 330A/330B are non-self-aligned source/drain contacts, so that the additional hard mask layers or dielectric layers are not necessary to protect the gate structures 306 during the formations of the source/drain contacts 330A/330B, unlike the formations of the self-aligned source/drain contacts. Therefore, the processing cost for the array 300 is reduced.

The ILD layer 334 and the IMD layer 336 include a dielectric material including, for example, silicon oxide, silicon nitride, silicon oxynitride, TEOS-formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In some embodiments, the ILD layer 334 and the IMD layer 336 are a dielectric layer that includes a low-k dielectric material (generally referred to as a low-k dielectric layer). The ILD layer 334 and the IMD layer 336 may include a multilayer structure having multiple dielectric materials.

Referring to FIGS. 4B to 4F, the array 300 further includes vias VG, vias VD, and metal layers M1. The vias VG and vias VD are disposed in the ILD layer 334 and the metal layers M1 are disposed in the IMD layer 336.

The metal layers M1 are over and electrically connected to respective gate structures 306 and respective source/drain contacts 330A and 330B. The vias VG are over the gate structures 306 and electrically connect the gate structures 306 to respective metal layers M1. The vias VD are over the source/drain contacts 330A/330B and electrically connect the source/drain contacts 330A and 330B to respective metal layers M1. The materials of the vias VG, the vias VD, and the metal layers M1 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

As shown in FIG. 4B to 4F, the metal layers M1 extend in the X-direction and further include metal layers MN, VM1, VM2, and VM3. The metal layers MN are disposed within the cell boundaries (e.g., the cell boundaries MC1 to MC6 of the circuit cells 302-1 to 302-6) in the top view, as shown in FIG. 4B. The metal layers VM1, VM2, and VM3 are disposed overlap (or across) the boundaries (e.g., the cell boundaries MC1 to MC6 of the circuit cells 302-1 to 302-6) in the top view, as shown in FIG. 4B. In some embodiments, a width of the metal layers VM1, VM2, and VM3 in the Y-direction is greater than a width of the metal layers MN in the Y-direction.

The metal layers M1 are respectively connected to respective gate structures 306 and respective dielectric gate structures 308 through respective vias VG and VD. In some embodiments, the vias VG, VD and metal lines M1 are used to construct connections of the transistors in the circuit cells 302-1 to 302-6. In some embodiments, the vias VD and metal lines M1 are connected to power sources or voltage sources (not shown) to provide voltage (VDD or VSS) to the transistors in the circuit cells 302-1 to 302-6. In the present embodiment, the metal lines VM1 and VM3 are connected to a VSS power source (not shown) and the metal line VM2 is connected to a VDD power source (not shown). Therefore, the metal line VM2 may be also referred to as the (VDD) power metal line, the (VDD) power line, or (VDD) power conductor, and the metal lines VM1 and VM3 may be also referred to as the (VSS) power metal line, the (VSS) power line, or (VSS) power conductor.

As shown in FIG. 4B the vias VD which electrically connected to the metal lines VM1 and VM3 has a larger via size than other vias VD and vias VG. Furthermore, the source/drain contacts 330B which electrically connected to the metal lines VM1 and VM3 has the wider width W2 (compared to the width W1 of the source/drain contacts 330A) and the metal lines VM1 and VM3 has the wider width (compared to the width of the metal lines MN). Therefore, due to small resistances of the larger size source/drain contacts 330B, larger size vias VD, and larger size metal lines VM1 and VM3, the transistors in the circuit cells 302-1 to 302-6 may be provided with voltage (or power) with low voltage drop, thereby improving the performance of the array 300.

Figure 5A:
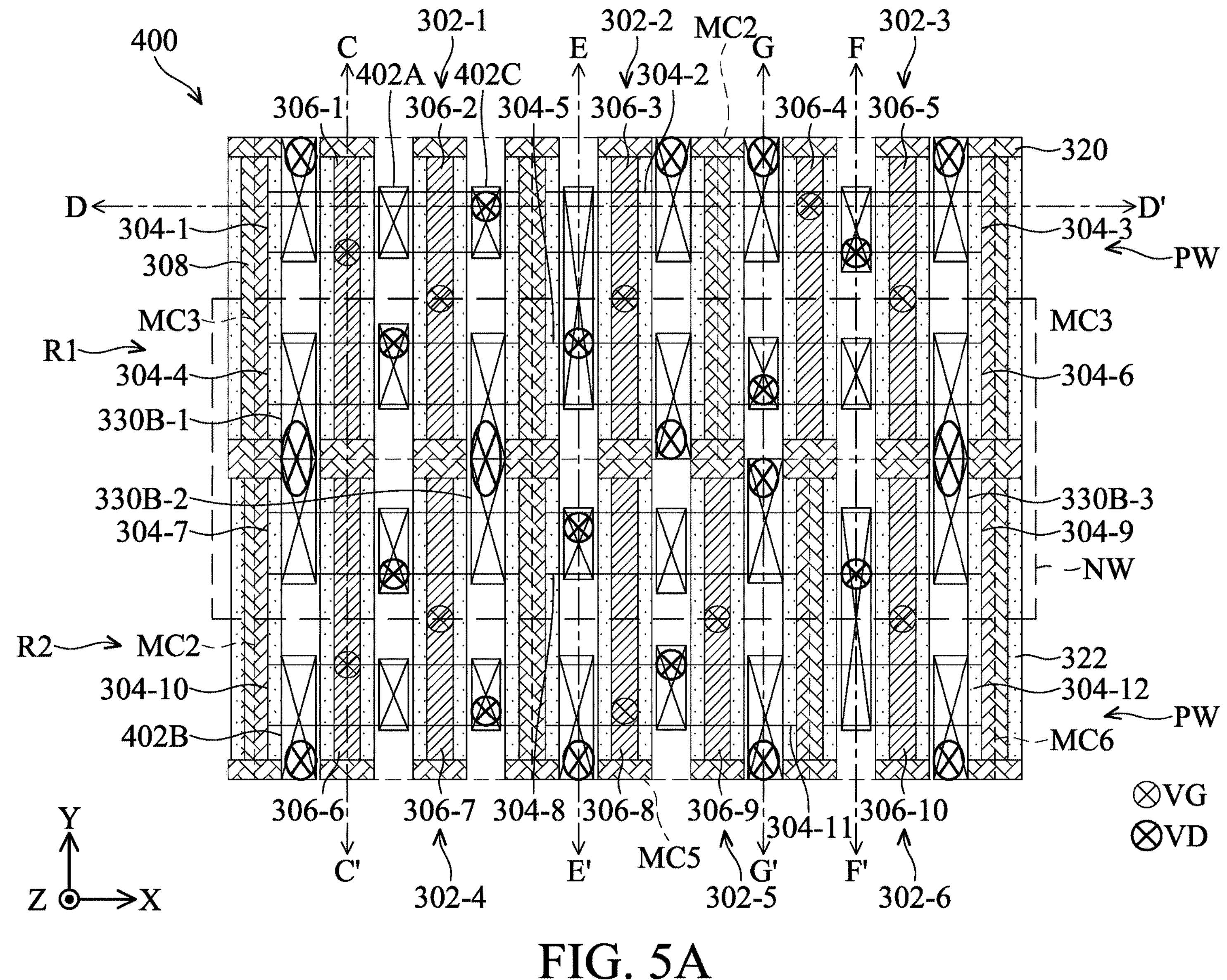
FIGS. 5A and 5B illustrate fragmentary diagrammatic top views of an array of circuit cells in the logic region of the IC chip, in accordance with some embodiments of the present disclosure.
Figure 5B:
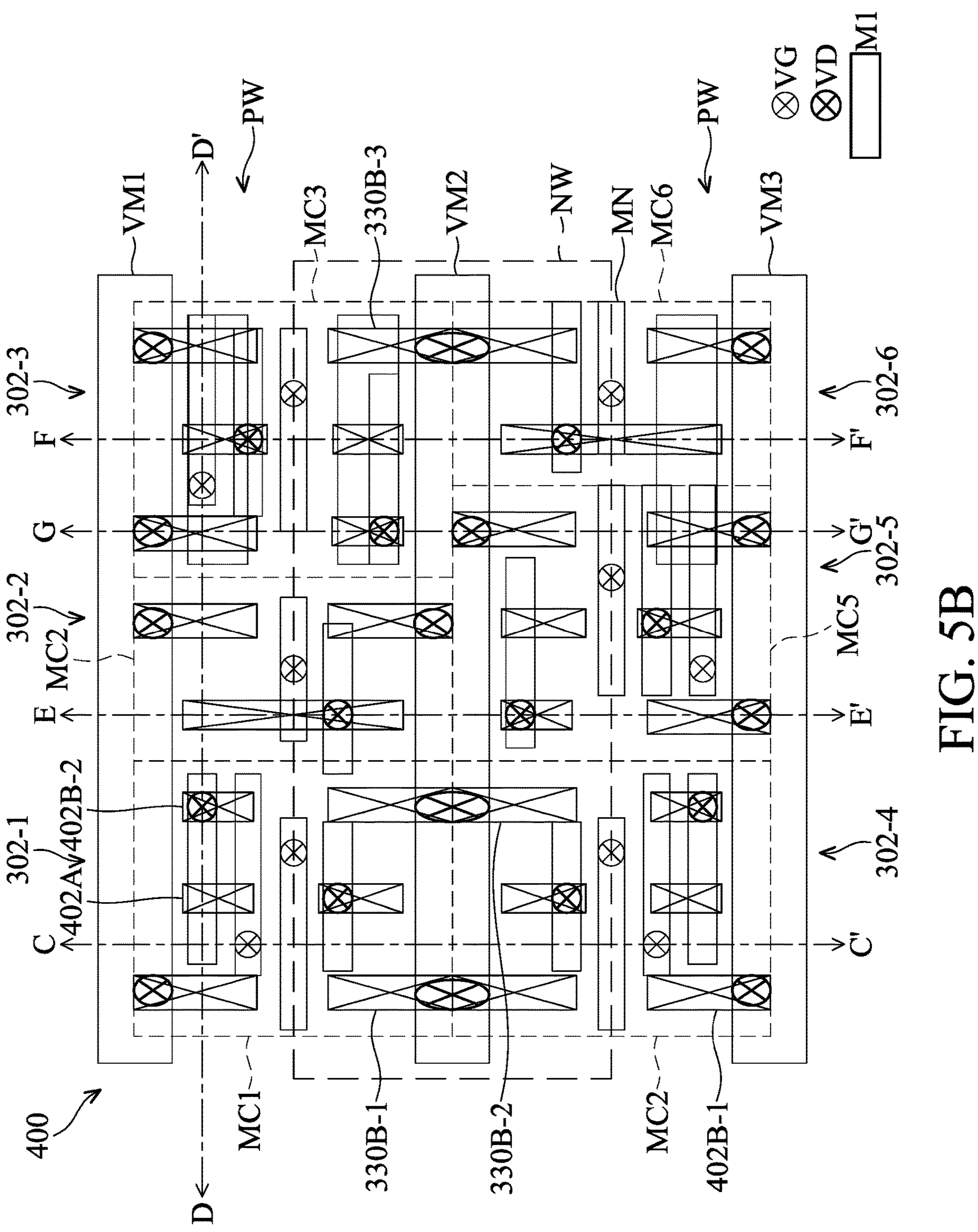

FIGS. 5A and 5B illustrate fragmentary diagrammatic top views (or layouts) of an array 400 of circuit cells in the logic region 20 of the IC chip 10, in accordance with some embodiments of the present disclosure. FIG. 5A illustrates features of transistors and vias connected to contact features and/or gate structures of the transistors, and FIG. illustrates the contact features of the transistors, the vias, and metal lines.

Figure 5C:
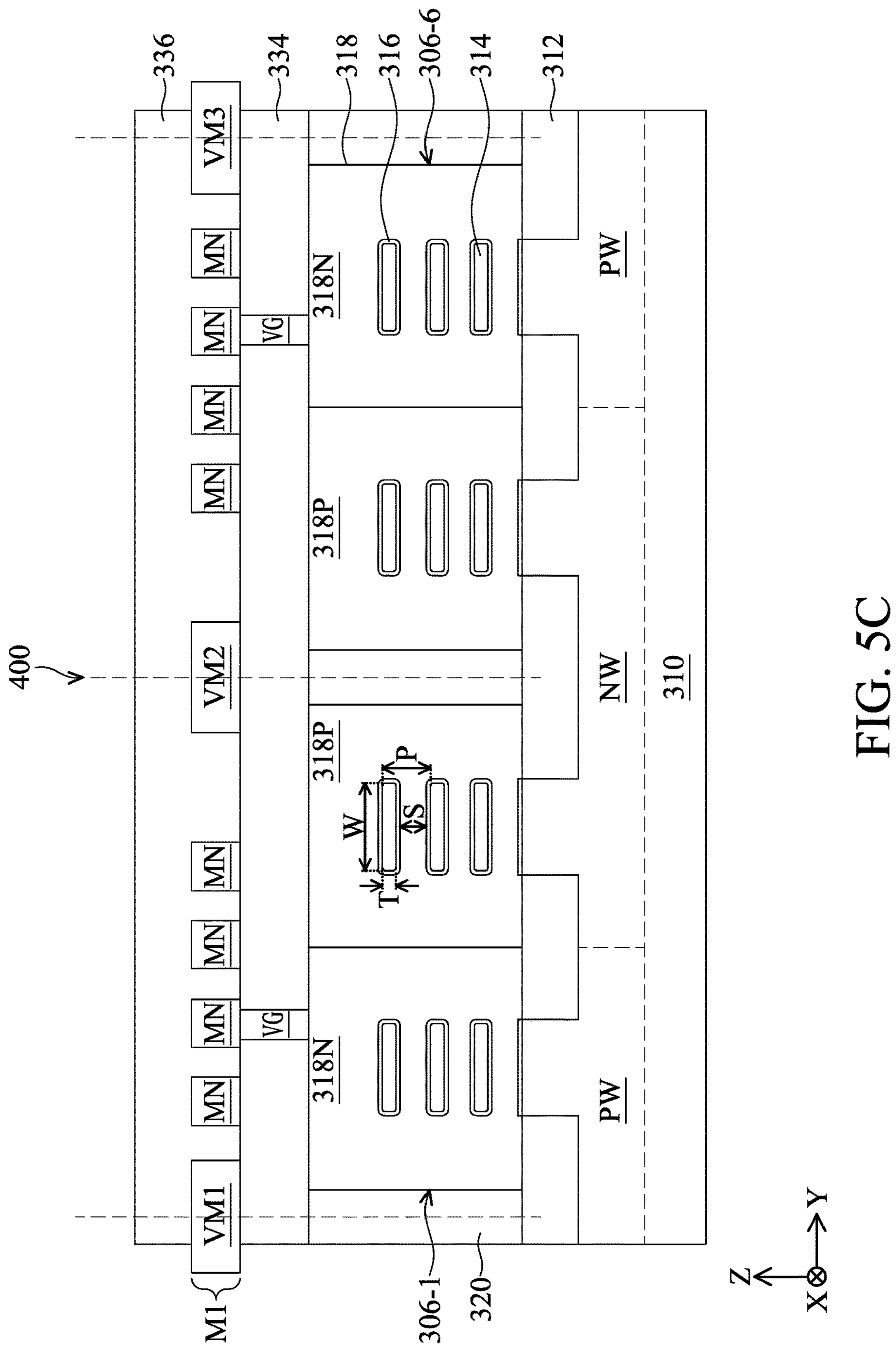
FIG. 5C illustrates a cross sectional view of the array of the circuit cells along a line C-C' in FIGS. 5A and 5B, in accordance with some embodiments of the present disclosure.
Figure 5D:
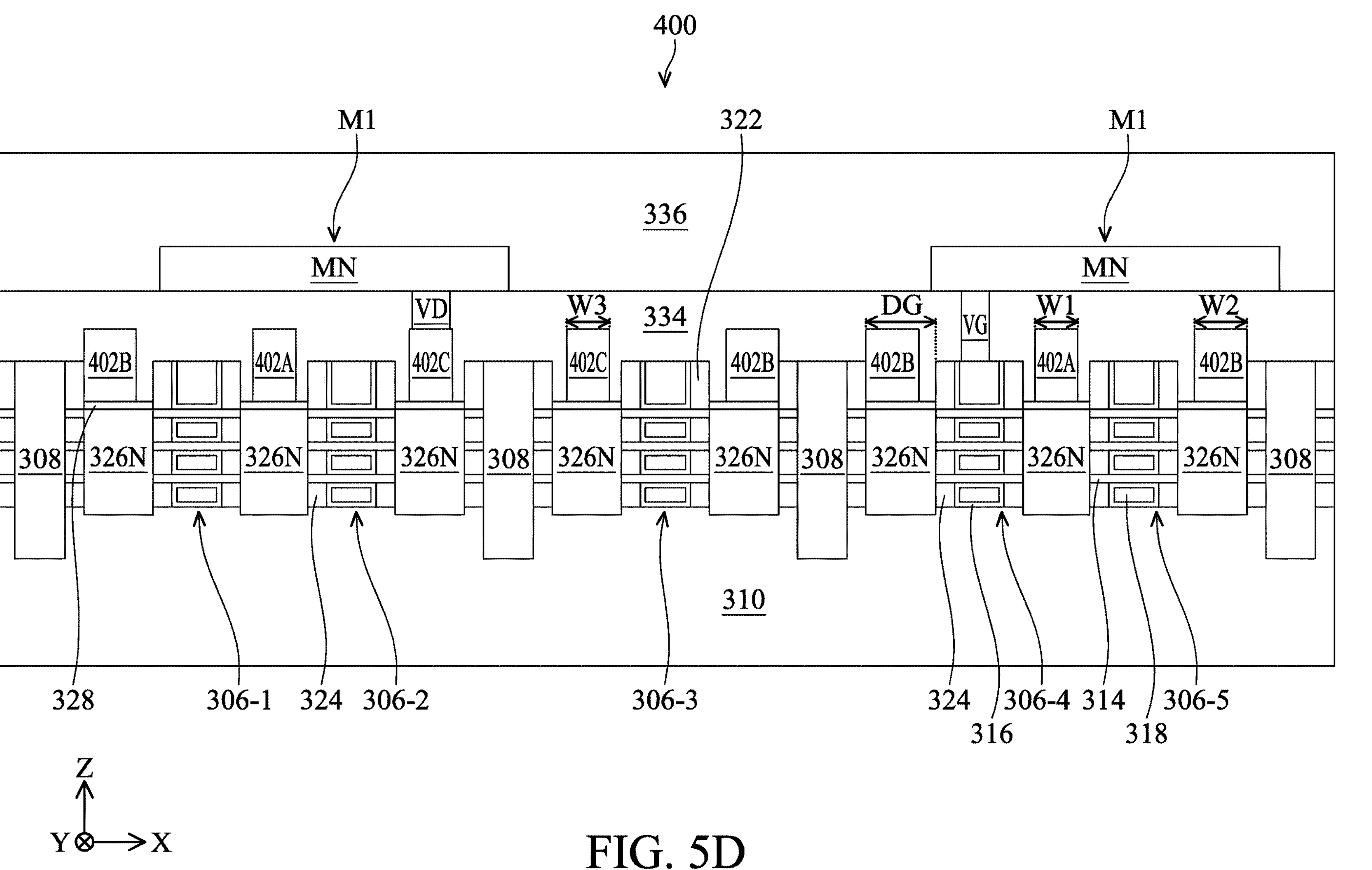
FIG. 5D illustrates a cross sectional view of the array of the circuit cells along a line D-D' in FIGS. 5A and 5B, in accordance with some embodiments of the present disclosure.
Figure 5E:
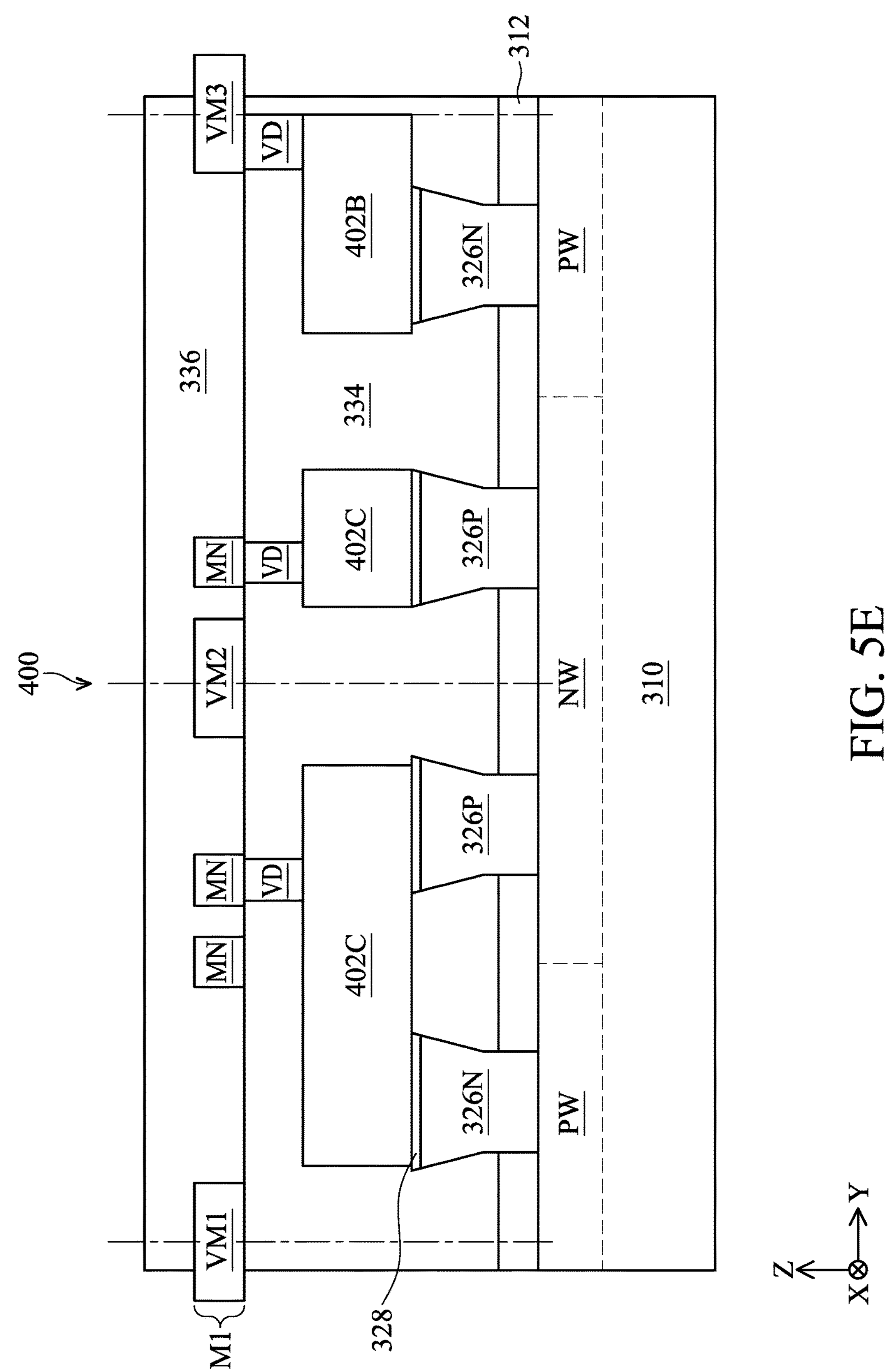
FIG. 5E illustrates a cross sectional view of the array of the circuit cells along a line E-E' in FIGS. 5A and 5B, in accordance with some embodiments of the present disclosure.
Figure 5F:
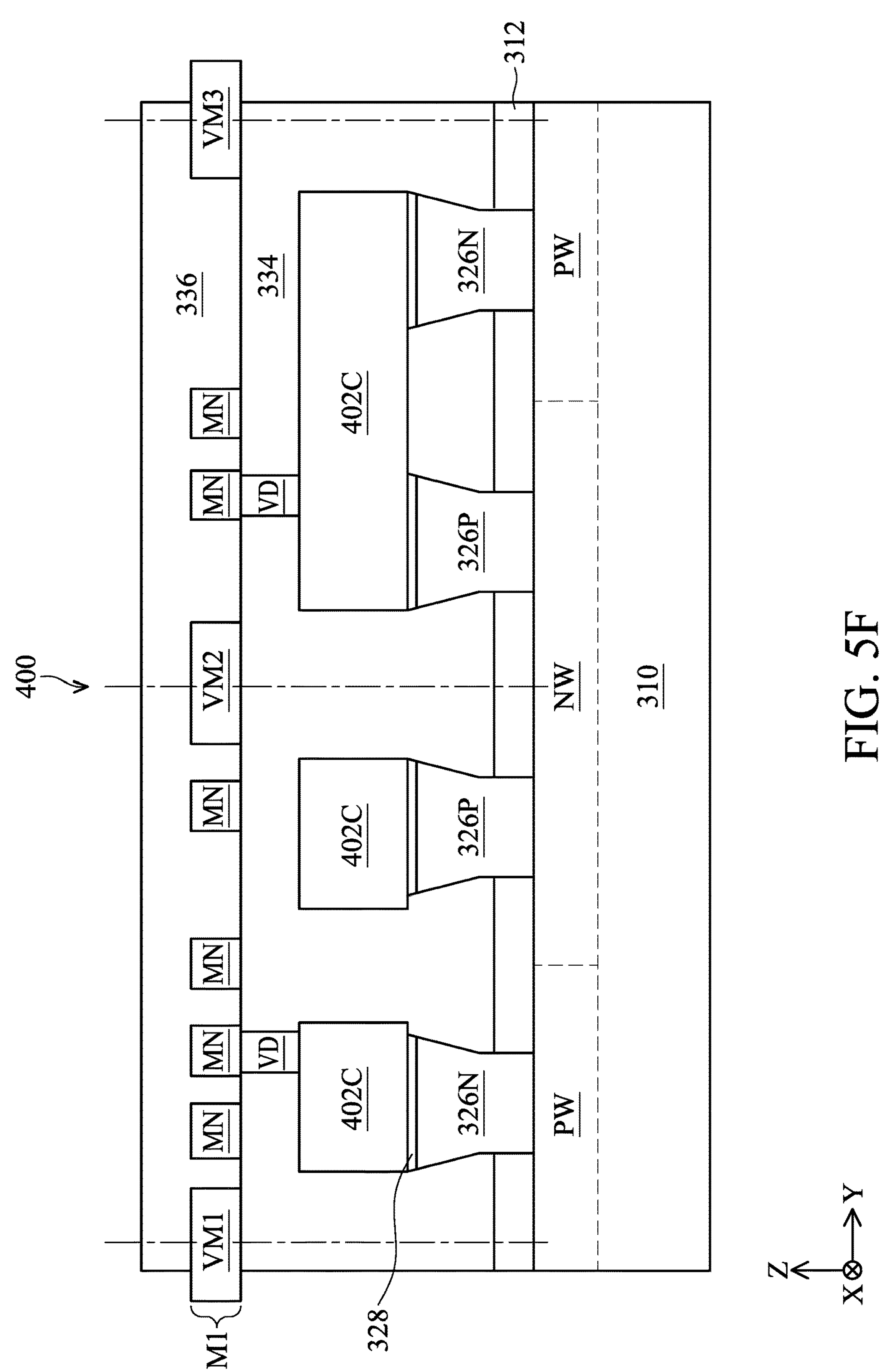
FIG. 5F illustrates a cross sectional view of the array of the circuit cells along a line F-F' in FIGS. 5A and 5B, in accordance with some embodiments of the present disclosure.
Figure 5G:
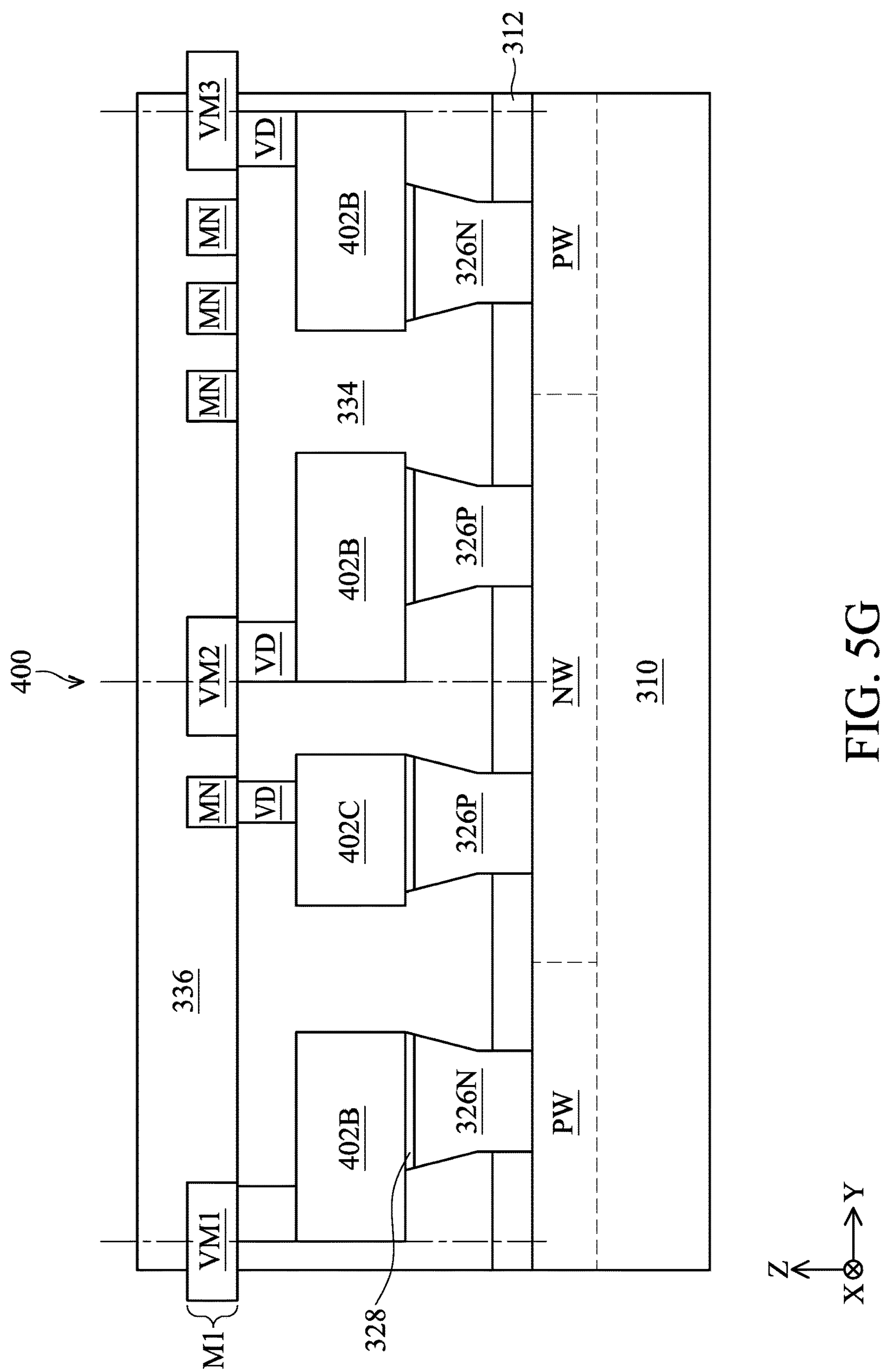
FIG. 5G illustrates a cross sectional view of the array of the circuit cells along a line G-G' in FIGS. 5A and 5B, in accordance with some embodiments of the present disclosure.

FIG. 5C illustrates a cross sectional view of the array 400 of the circuit cells along a line C-C' in FIGS. 5A and 5B, in accordance with some embodiments of the present disclosure. FIG. 5D illustrates a cross sectional view of the array 400 of the circuit cells along a line D-D' in FIGS. 5A and 5B, in accordance with some embodiments of the present disclosure. FIG. 5E illustrates a cross sectional view of the array 400 of the circuit cells along a line E-E' in FIGS. 5A and 5B, in accordance with some embodiments of the present disclosure. FIG. 5F illustrates a cross sectional view of the array 400 of the circuit cells along a line F-F' in FIGS. 5A and 5B, in accordance with some embodiments of the present disclosure. FIG. 5G illustrates a cross sectional view of the array 400 of the circuit cells along a line G-G' in FIGS. 5A and 5B, in accordance with some embodiments of the present disclosure.

The array 400 is similar to array 300 discussed above. Specifically, the array 400 also includes the circuit cells 302-1 to 302-6 constructed by the transistors. The active areas 304, the gate structures 306, the dielectric gate structures 308, the substrate 310, the isolation feature 312, the nanostructures 314, the gate dielectric layer 316, the gate electrode layer 318, the gate end dielectrics 320, the gate spacers 322, the inner spacers 324, the source/drain features 326N/326P, the silicide features 328, the ILD layer 334, the IMD layer 336, the vias VG, the vias VD, the metal layers M1 in the array 400 are similar to those in the array 300 and have been discussed in detail above.

Differences among the array 400 and the array 300 are the source/drain contacts. Referring to FIGS. 5A to 5G, the array 400 includes three types of source/drain contacts, such as source/drain contacts 402A, source/drain contacts 402B, and source/drain contacts 402C. The source/drain contacts 402A, 402B, and 402C extend in the Y-direction, are over the source/drain features 326N and 326P, and electrically connect to the source/drain features 326N and 326P.

As shown in FIGS. 5A to 5G, the source/drain contacts 402A, 402B, and 402C are also non-self-aligned source/drain contacts. Similarly, a width W1 of the source/drain contacts 402A, a width W2 of the source/drain contacts 402B, and a width W3 of the source/drain contacts 402C in the X-direction are less than the distance DG between adjacent two gate spacers 322 respectively on sidewalls of two adjacent gate structures 306 (or adjacent one gate structure 306 and one dielectric gate structure 308), as shown in FIG. 5D. In some embodiments, the width W1 of the source/drain contacts 402A, the width W2 of the source/drain contacts 402B, and the width W3 of the source/drain contacts 402C are less than the width of the source/drain features 326N and 326P.

The source/drain contacts 402A are source/drain contacts between adjacent two of the gate structures 306. The source/drain contacts 402B are source/drain contacts that are located between adjacent one of the gate structures 306 and one of the dielectric gate structures 308, and electrically connected to the power conductors (e.g., the metal lines VM1 to VM3). The source/drain contacts 402C are source/drain contacts that are located between adjacent one of the gate structures 306 and one of the dielectric gate structures 308, and not electrically connected to the power conductors (e.g., the metal lines VM1 to VM3).

Similarly to the source/drain contacts 330B discussed above, the source/drain contacts 402B may have a larger width W2 in the X-direction. Furthermore, each of the source/drain contacts 402B is closer to the one of the dielectric gate structures 308 than to the one of the gate structures 306. More specifically, a distance from the source/drain contact 402B to the gate structure 306 is greater than a distance from the second source/drain contact 402B to the dielectric gate structure 308. This is because the dielectric gate structures 308 are not functional gate structures, so that the source/drain contacts 402B may have a larger width W2 and extend toward the dielectric gate structures 308 without impacting the isolation margin and maintaining the reliability margin between contacts and gate structures. Therefore, the source/drain contacts 402B may have a larger contact size to have smaller resistance.

As shown in FIGS. 5A and 5D, a distance from the source/drain contact 402C to the gate structure 306 and a distance from the second source/drain contact 402C to the dielectric gate structure 308 are substantially the same. In some embodiments, each of the source/drain contacts 402C is also closer to a dielectric gate structure 308 than it is to a gate structure 306. This is because the dielectric gate structures 308 are not functional gate structures, so the source/drain contacts 402B may have shifted toward the dielectric gate structures 308 without impacting the isolation. In such embodiments, the distance from the source/drain contact 402C to the gate structure 306 is greater than the distance from the second source/drain contact 402C to the dielectric gate structure 308. Therefore, the source/drain contact 402C may have a lower contact-to-gate parasitic capacitance.

In the present embodiment, the width W1 of the source/drain contacts 402A and the width W3 of the source/drain contacts 402C are substantially the same. The width W2 of the source/drain contacts 402B is greater than the width W1 of the source/drain contacts 402A and the width W3 of the source/drain contacts 402C. In some embodiments, a ratio of the width W2 of the source/drain contacts 402B to the width W1 of the source/drain contacts 402A is in a range from about 1.05 to about 1.25. In some embodiments, a ratio of the width W2 of the source/drain contacts 402B to the width W3 of the source/drain contacts 402C is in a range from about 1.05 to about 1.25. In some embodiments, the width W1 of the source/drain contacts 402A is in a range from about 6 nm to about 30 nm; the width W2 of the source/drain contacts 402B is in a range from about 6 nm to about 30 nm; and the width W3 of the source/drain contacts 402C is in a range from about 6 nm to about 30 nm.

The source/drain contacts 402A, 402B, and 402C may each include a conductive material such as Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 402A, 402B, and 402C may each include single conductive material layer or multiple conductive layers.

As discussed above, the contact sidewall layers 332 are optional and the source/drain contacts may be formed without the contact sidewall layers 332 on their sidewalls. Therefore, the sidewalls of the source/drain contacts 402B (and/or the source/drain contacts 402C) may be in contact with the gate spacers 322 on the sidewalls of the dielectric gate structure 308, as shown in FIG. 5D. In other embodiments, the sidewalls of the source/drain contacts 402B (and/or the source/drain contacts 402C) are separated from the gate spacers 322 on the sidewalls of the dielectric gate structure 308 without the contact sidewall layers 332.

The embodiments disclosed herein relate to semiconductor structures, and more particularly to semiconductor structures comprising non-self-aligned source/drain contacts for the transistors in the circuit cells. Furthermore, the present embodiments provide one or more of the following advantages. The non-self-aligned source/drain contacts for the transistors provides a lower contact-to-gate parasitic capacitances and makes it is hard for the current to break down from contact to gate, which improves the performance of the circuit cells, such as circuit speed. Furthermore, the formation of the non-self-aligned source/drain contacts do not cause any additional hard mask layers or dielectric layers to be formed over the gate structures, thereby decreasing the processing cost for the transistors in the circuit cells.

Thus, one of the embodiments of the present disclosure describes a semiconductor structure that includes a circuit cell having transistors. Each of the transistors includes nanostructures vertically stacked from each other and a gate structure wrapping around the nanostructures and extending in a first direction. The semiconductor structure further includes a dielectric gate structure extending in the first direction and adjacent to the circuit cell in a second direction that is perpendicular to the first direction, a first source/drain feature between adjacent two of the gate structures, and a second source/drain feature between one of the gate structures and the dielectric gate structure. The semiconductor structure further includes a first source/drain contact over the first source/drain feature and a second source/drain contact over the second source/drain feature. The first source/drain contact has a first width in the second direction. The second source/drain contact has a second width in the second direction. The second width is greater than the first width.

In some embodiments, a ratio of the second width to the first width is in a range from about 1.05 to about 1.25.

In some embodiments, the first width is in a range from about 6 nm to about 30 nm and the second width is in a range from about 6 nm to about 30 nm.

In some embodiments, the semiconductor structure further includes gate spacers on sidewalls of the gate structures and the dielectric gate structure.

In some embodiments, the first source/drain feature and the second source/drain feature each has a third width in the second direction, and the third width is greater than the first width and the second width.

In some embodiments, the second source/drain contact is in contact with the gate spacer on the sidewall of the dielectric gate structure.

In some embodiments, the semiconductor structure further includes a power conductor overlapping a cell boundary in a top view and a via electrically connecting the second source/drain contact to the power conductor.

In some embodiments, the semiconductor structure further includes contact sidewall layers surrounding the first source/drain contact and the second source/drain contact.

In some embodiments, the contact sidewall layers include dielectric material selected from a group consisting of $Si_3N_4$, SiON, SiOC, SiOCN, or a combination thereof.

In some embodiments, the contact sidewall layers have a thickness in a range from about 0.3 nm to about 2 nm.

In another of the embodiments, discussed is a semiconductor structure including circuit cells. Each of the circuit cells includes nanostructures vertically stacked from each other; and gate structures wrapping around the nanostructures and extending in a first direction. The semiconductor structure further includes dielectric gate structures extending in the first direction and separating the circuit cells from each other in a second direction. The second direction is perpendicular to the first direction. The semiconductor structure further includes gate spacers on sidewalls of the gate structures and the dielectric gate structure, first source/drain features, second source/drain features, first source/drain contacts over the first source/drain features and extending in the first direction, and second source/drain contacts over the second source/drain features and extending in the first direction. Each of the first source/drain features is between adjacent two of the gate structures. Each of the second source/drain features is between one of the gate structures and one of the dielectric gate structures. A width of the second source/drain contacts is greater than a width of the first source/drain contacts.

In some embodiments, each of the second source/drain contacts is closer to the one of the dielectric gate structures than to the one of the gate structures.

In some embodiments, the semiconductor structure further includes contact sidewall layers on sidewalls of the first source/drain contacts and sidewalls of the second source/drain contacts.

In some embodiments, the contact sidewall layers on the sidewalls of the second source/drain contact are in contact with the gate spacers on the sidewalls of the dielectric gate structure.

In some embodiments, the contact sidewall layers on the sidewalls of the second source/drain contact are separated from the gate spacers on the sidewalls of the dielectric gate structure.

In some embodiments, the semiconductor structure further includes an inter-layer dielectric layer over the gate structures, the dielectric gate structures, the first source/drain contacts, and the second source/drain contacts, wherein the gate structures are in direct contact with the inter-layer dielectric layer.

In some embodiments, the semiconductor structure further includes a power conductor extending in the second direction and electrically connected to the second source/drain contacts.

In yet another of the embodiments, discussed is a semiconductor structure that includes a circuit cell. The circuit cell includes a first gate structure extending in a first direction and wrapping around first nanostructures vertically stacked from each other; and a second gate structure extending in the first direction, wrapping around second nanostructures vertically stacked from each other, and adjacent to the first gate structure in a second direction. The second direction is perpendicular to the first direction. The semiconductor structure further includes a dielectric gate structure extending in the first direction and on a cell boundary of the circuit cell, a first source/drain feature between the first gate structure and the second gate structure, a second source/drain feature between the second gate structure and the dielectric gate structure, a first source/drain contact over the first source/drain feature and having a first width in the second direction, and a second source/drain contact over the second source/drain feature and having a second width greater than the first width in the second direction.

In some embodiments, the second source/drain contact extends in the first direction to overlap the cell boundary of the circuit cell in a top view.

In some embodiments, a distance from the second source/drain contact to the second gate structure is greater than a distance from the second source/drain contact to the dielectric gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a circuit cell having transistors, wherein each of the transistors comprises:
  nanostructures vertically stacked from each other; and
  a gate structure wrapping around the nanostructures and extending in a first direction;
a dielectric gate structure extending in the first direction and adjacent to the circuit cell in a second direction that is perpendicular to the first direction;
first gate spacers on sidewalls of the dielectric gate structure;
a first source/drain feature between adjacent two of the gate structures;

a second source/drain feature between one of the gate structures and the dielectric gate structure;

a first source/drain contact over the first source/drain feature and having a first width in the second direction;

a second source/drain contact over the second source/drain feature and having a second width in the second direction, wherein the second width is greater than the first width, wherein a top surface of the second source/drain contact is higher than a top surface of the dielectric gate structure;

a first contact sidewall layer surrounding the second source/drain contact; and an inter-layer dielectric layer over the gate structures, the dielectric gate structure, and the first gate spacers, wherein an interface between the inter-layer dielectric layer and the first gate spacers interfaces a sidewall of the first contact sidewall layer.

2. The semiconductor structure of claim 1, wherein a ratio of the second width to the first width is in a range from 1.05 to 1.25.

3. The semiconductor structure of claim 1, further comprising:

second gate spacers on sidewalls of the gate structures.

4. The semiconductor structure of claim 3, wherein:

the first source/drain feature and the second source/drain feature each has a third width in the second direction, and the third width is greater than the first width and the second width.

5. The semiconductor structure of claim 4, wherein the second source/drain contact is in contact with the gate spacer on the sidewall of the dielectric gate structure.

6. The semiconductor structure of claim 1, further comprising:

a power conductor overlapping a cell boundary in a top view; and a via electrically connecting the second source/drain contact to the power conductor.

7. The semiconductor structure of claim 1, further comprising:

second contact sidewall layers surrounding the first source/drain contact.

8. The semiconductor structure of claim 7, wherein the contact sidewall layers include dielectric material selected from a group consisting of $Si_3N_4$, SiON, SiOC, SiOCN, or a combination thereof.

9. The semiconductor structure of claim 7, wherein the contact sidewall layers have a thickness in a range from 0.3 nm to 2 nm.

10. The semiconductor structure of claim 1, wherein top surfaces of the first source/drain contact and the second source/drain contact are higher than a top surface of the dielectric gate structure.

11. A semiconductor structure, comprising:

circuit cells, wherein each of the circuit cells comprises: nanostructures vertically stacked from each other; and gate structures wrapping around the nanostructures and extending in a first direction;

dielectric gate structures extending in the first direction and separating the circuit cells from each other in a second direction that is perpendicular to the first direction;

gate spacers on sidewalls of the gate structures and the dielectric gate structure;

first source/drain features, wherein a first one of the first source/drain features is between adjacent two of the gate structures;

second source/drain features, wherein a first one of the second source/drain features is between one of the gate structures and one of the dielectric gate structures;

a first silicide feature over the first one of the first source/drain features and a second silicide feature over the first one of the second source/drain features;

a first source/drain contact over the first one of the first source/drain features and extending in the first direction;

a second source/drain contact over the first one of the second source/drain features and extending in the first direction, wherein a width of the second source/drain contacts is greater than a width of the first source/drain contact; and a contact sidewall layer on a sidewall of the second source/drain contact, wherein a bottom point of an outer sidewall of the contact sidewall layer intersects with a top point of an outer sidewall of the second silicide feature, and a bottom point of the outer sidewall of the second silicide feature intersects with a top point of an outer sidewall of the first one of the second source/drain features.

12. The semiconductor structure of claim 11, wherein each of the second source/drain contacts is closer to the one of the dielectric gate structures than to the one of the gate structures.

13. The semiconductor structure of claim 11, wherein the contact sidewall layers on the sidewalls of the second source/drain contact are in contact with the gate spacers on the sidewalls of the dielectric gate structure.

14. The semiconductor structure of claim 11, wherein the contact sidewall layers on the sidewalls of the second source/drain contact are separated from the gate spacers on the sidewalls of the dielectric gate structure.

15. The semiconductor structure of claim 11, further comprising:

an inter-layer dielectric layer over the gate structures, the dielectric gate structures, the first source/drain contacts, and the second source/drain contacts, wherein the gate structures are in direct contact with the inter-layer dielectric layer.

16. The semiconductor structure of claim 11, further comprising:

a power conductor extending in the second direction and electrically connected to the second source/drain contacts.

17. The semiconductor structure of claim 11, wherein the second source/drain contact is electrically connected to two of the second source/drain features separated in the first direction.

18. The semiconductor structure of claim 11, wherein interfaces between the silicide features and the second source/drain features are higher than bottom surfaces of the gate spacers.

19. A semiconductor structure, comprising:

a circuit cell, wherein the circuit cell comprises:

a first gate structure extending in a first direction and wrapping around first nanostructures vertically stacked from each other; and a second gate structure extending in the first direction, wrapping around second nanostructures that are vertically stacked from each other, and adjacent to the first gate structure in a second direction that is perpendicular to the first direction;

a dielectric gate structure extending in the first direction and on a cell boundary of the circuit cell;

a first source/drain feature between the first gate structure and the second gate structure;

a second source/drain feature between the second gate structure and the dielectric gate structure;

a first source/drain contact over the first source/drain feature and having a first width in the second direction; and a second source/drain contact over the second source/drain feature and having a second width greater than the first width in the second direction, wherein the second source/drain contact extends in the first direction across the cell boundary of the circuit cell in a top view, wherein a distance from the second source/drain contact to the second gate structure at a first level is greater than a distance from the second source/drain contact to the dielectric gate structure at the first level.

20. The semiconductor structure of claim 19, further comprising:

a contact sidewall layer on sidewalls of the second source/drain contact and separated from a bottom surface of the second source/drain contact.

* * * * *